(12) United States Patent
Bok

(10) Patent No.: US 11,726,622 B2
(45) Date of Patent: Aug. 15, 2023

(54) DISPLAY DEVICE FOR DETECTING INCIDENT LIGHT

(71) Applicant: SAMSUNG DISPLAY CO., LTD., Yongin-si (KR)

(72) Inventor: Seung Lyong Bok, Gyeonggi-do (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 0 days.

(21) Appl. No.: 17/818,398

(22) Filed: Aug. 9, 2022

(65) Prior Publication Data
US 2023/0134963 A1    May 4, 2023

(30) Foreign Application Priority Data

Oct. 28, 2021 (KR) .......................... 10-2021-0145375

(51) Int. Cl.
*G06F 3/044* (2006.01)
*G06V 40/13* (2022.01)
(Continued)

(52) U.S. Cl.
CPC .......... *G06F 3/0443* (2019.05); *G06F 3/0412* (2013.01); *G06V 40/1318* (2022.01); *G09G 3/3233* (2013.01); *H10K 59/122* (2023.02); *H10K 59/1213* (2023.02); *H10K 59/131* (2023.02); *H10K 59/40* (2023.02); *H10K 59/65* (2023.02); *G06F 3/0446* (2019.05); *G09G 2300/0452* (2013.01); *G09G 2300/0819* (2013.01); *G09G 2300/0842* (2013.01);
(Continued)

(58) Field of Classification Search
CPC .... G06F 3/0412; G06F 3/0443; G06F 3/0446; G09G 3/3233

USPC .......................................................... 345/174
See application file for complete search history.

(56) References Cited

U.S. PATENT DOCUMENTS 10,079,276 B2 * 9/2018 Park ...................... H10K 59/131
2019/0073505 A1 * 3/2019 Kwon ..................... H01L 27/323
(Continued)

FOREIGN PATENT DOCUMENTS

KR    10-0873497       12/2008
KR    10-2017-0109651   9/2017
(Continued)

OTHER PUBLICATIONS

Korean Information Display Society (in Korean), 13 pages.

*Primary Examiner* — Calvin C Ma
(74) *Attorney, Agent, or Firm* — F. Chau & Associates, LLC

(57) ABSTRACT

A display device is provided. A display device comprises a substrate, a plurality of pixels disposed on the substrate and having a first emission area and a second emission area configured to emit light, a plurality of optical sensors disposed on the substrate and comprising a light-sensing transistor having a first sensing channel configured to sense light, a bank disposed on the pixels and the optical sensors, and a touch conductive layer disposed on the bank and having touch electrodes, wherein the touch conductive layer comprises light transmitting portions disposed between the first emission area, the second emission area, and the touch electrodes, and the light transmitting portion overlaps the bank and the light-sensing transistor in a thickness direction of the substrate.

17 Claims, 24 Drawing Sheets

(51) Int. Cl.
*G06F 3/041* (2006.01)
*G09G 3/3233* (2016.01)
*H10K 59/40* (2023.01)
*H10K 59/65* (2023.01)
*H10K 59/122* (2023.01)
*H10K 59/131* (2023.01)
*H10K 59/121* (2023.01)
*H01L 27/12* (2006.01)
*H01L 29/786* (2006.01)

(52) U.S. Cl.
CPC . *G09G 2300/0861* (2013.01); *G09G 2354/00* (2013.01); *H01L 27/1225* (2013.01); *H01L 29/7869* (2013.01); *H01L 29/78675* (2013.01)

(56) References Cited

U.S. PATENT DOCUMENTS

2020/0395421 A1* 12/2020 He ................ G06F 21/32
2021/0233988 A1* 7/2021 Wei ................ G09G 3/3233

FOREIGN PATENT DOCUMENTS

| KR | 10-2018-0028085 | 3/2018 |
| KR | 10-2013-0058405 | 9/2018 |
| KR | 10-2021-0029891 | 3/2021 |

\* cited by examiner

SE: RE, TE, DE
CP: CP1, CP2

220: SE, OP, PH

220: SE, OP, PH

DISPLAY DEVICE FOR DETECTING INCIDENT LIGHT

CROSS-REFERENCE TO RELATED APPLICATIONS

This application claims priority under 35 U.S.C. § 119 to Korean Patent Application No. 10-2021-0145375 filed on Oct. 28, 2021 in the Korean Intellectual Property Office, the disclosure of which is incorporated by reference herein in its entirety.

TECHNICAL FIELD

The following relates generally to a display device, and more specifically to a display device for detecting incident light.

DISCUSSION OF RELATED ART

A display device is an output device for presentation of information in visual form. Display devices are employed in various electronic devices, such as smartphones, digital cameras, laptop computers, navigation devices, smart watches, smart televisions, and the like. Examples of a display device include a flat panel display device such as a liquid crystal display device, a field emission display device, and an organic light emitting display device.

A display device may attempt to include a fingerprint sensor in a display panel of the display device. However, electrodes within the display device may block light reflected from a user fingerprint from reaching optical sensors in the display device.

SUMMARY

Aspects of the present disclosure provide a display device configured to allow light reflected by a user's fingerprint to be incident on optical sensors without being blocked by electrodes within the display device.

According to at least one embodiment of the present disclosure, a display device includes a substrate, a plurality of pixels disposed on the substrate and including a first emission area and a second emission area configured to emit light, a plurality of optical sensors disposed on the substrate and including a light-sensing transistor including a first sensing channel configured to sense light, a bank disposed on the plurality of pixels and the plurality of optical sensors, and a touch conductive layer disposed on the bank and including touch electrodes. The touch conductive layer includes a light-transmission opening disposed between the first emission area, the second emission area, and the touch electrodes, and the light-transmission opening overlaps the bank and the light-sensing transistor in a thickness direction of the substrate.

In at least one embodiment, the touch electrode does not overlap the light-sensing transistor.

In at least one embodiment, the light-transmission opening overlaps the first sensing channel in the thickness direction of the substrate.

In at least one embodiment, the display device further includes a light-blocking layer disposed on the touch electrode and comprising a light-blocking layer opening through which light is incident, wherein the light-blocking layer opening overlaps the light-transmission opening, the bank, and the first sensing channel in the thickness direction of the substrate.

In at least one embodiment, the display device further includes a connector configured to connect a proximate pair of the touch electrodes through a contact hole, and an auxiliary touch electrode disposed on the same layer as the connector. The auxiliary touch electrode includes a first hole overlapping the light-transmission opening in the thickness direction of the substrate.

In at least one embodiment, a width of the light-transmission opening is smaller than a width of the first hole.

In at least one embodiment, at least one pixel of the plurality of pixels includes a light emitting element, a first transistor providing a driving current to the light emitting element and including a first channel, a first electrode, and a second electrode, and a second transistor electrically connected to the first electrode or the second electrode and including a second channel. The first channel and the second channel include different materials from each other.

In at least one embodiment, the first channel includes polysilicon, and each of the second channel and the first sensing channel include an oxide semiconductor.

In at least one embodiment, at least one optical sensor of the plurality of optical sensors further includes a sensing switch transistor including a second sensing channel and a gate electrode connected to a first sensing scan line, and the light-sensing transistor includes a gate electrode connected to a second sensing scan line.

In at least one embodiment, the gate electrode of the light-sensing transistor is disposed on the first sensing channel.

In at least one embodiment, the second sensing channel is disposed on a same layer as the first sensing channel.

In at least one embodiment, the light-transmission opening does not overlap the second sensing channel.

In at least one embodiment, the plurality of pixels include an $i^{th}$ pixel and an $(i+1)^{th}$ pixel adjacent to each other, and i is a positive integer. The display device further includes a read-out line disposed in the $i^{th}$ pixel and outputting a light-sensing voltage, and a driving voltage line disposed in the $(i+1)^{th}$ pixel and outputting a driving voltage. At least one optical sensor of the plurality of optical sensors is connected to the read-out line and the driving voltage line.

In at least one embodiment, the touch conductive layer includes a light-emission opening exposing the first emission area and the second emission area, and a size of the light-emission opening is larger than a size of the light-transmission opening.

In at least one embodiment, the touch conductive layer further includes a plurality of slits exposing gaps between proximate pairs of the plurality of pixels, and at least one slit of the plurality of slits overlaps the bank and does not overlap the light-sensing transistor.

According to at least one embodiment of the present disclosure, a display device includes a substrate, a first semiconductor layer including a first channel disposed on the substrate, a first gate layer disposed on the first semiconductor layer and including a gate electrode overlapping the first channel, a second gate layer disposed on the first gate layer and including a first sensing scan line, a second semiconductor layer disposed on the second gate layer and including a first sensing channel overlapping the first sensing scan line; and a touch conductive layer including touch electrodes disposed on the second semiconductor layer and at least one light-transmission opening disposed between a proximate pair of the touch electrodes and overlapping the first sensing channel. The touch electrode does not overlap the first sensing channel.

In at least one embodiment, the second gate layer further includes a scan line and a second sensing scan line spaced apart from the first sensing scan line, the scan line overlaps a second channel of the second semiconductor layer, and the second sensing scan line overlaps a second sensing channel of the second semiconductor layer.

In at least one embodiment, the first semiconductor layer includes polysilicon, and the second semiconductor layer includes an oxide semiconductor.

In at least one embodiment, the second semiconductor layer includes a light-sensitive oxide semiconductor.

In at least one embodiment, the first sensing channel includes a first sub-sensing channel and a second sub-sensing channel disposed on a bottom surface of the first sub-sensing channel, the first sub-sensing channel includes a light-sensitive oxide semiconductor, and the second sub-sensing channel includes a light-insensitive oxide semiconductor.

According to some aspects, the display device includes a plurality of light-transmission openings overlapping optical sensors, and external light thereby reaches the optical sensors through the plurality of light-transmission openings. Accordingly, the optical sensors detect light incident from above a display panel of the display device.

BRIEF DESCRIPTION OF THE DRAWINGS

The above and other aspects and features of the present disclosure will become more apparent by describing in detail embodiments thereof with reference to the accompanying drawings, in which.

DETAILED DESCRIPTION

Figure 1:
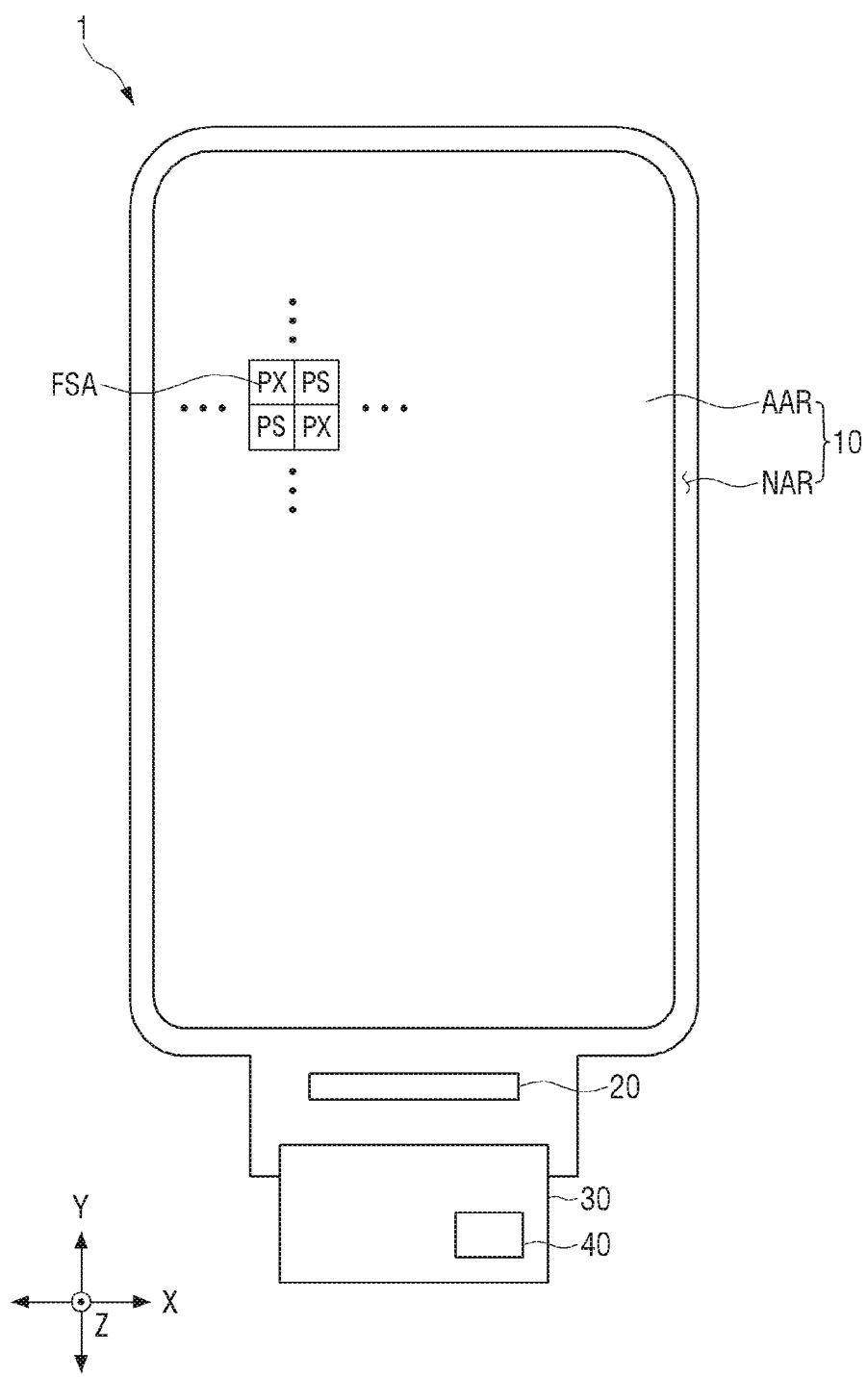
FIG. 1 is a plan view illustrating a display device according to at least one embodiment.

Embodiments of the present disclosure will be described more fully hereinafter with reference to the accompanying drawings. Like reference numerals may refer to like elements throughout the accompanying drawings.

It will be understood that when an element or layer is referred to as being "on", "over", "above", "below", "under", "beneath", "connected to", or "coupled to" another element layer, it can be directly on, over, above, below, under, beneath, connected to, or coupled to the other element or layer, or intervening elements or layers may be present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of embodiments of the present disclosure. Similarly, the second element could also be termed the first element.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value according to embodiments, the parameter may be exactly the certain value or approximately the certain value within a measurement error as would be understood by a person having ordinary skill in the art.

FIG. 1 is a plan view illustrating a display device according to at least one embodiment.

Referring to FIG. 1, the display device 1 is implemented as various electronic devices that include a display screen. Examples of the display device 1 include a mobile phone, a smart phone, a tablet personal computer (PC), a mobile communication terminal, an electronic notebook, an electronic book, a personal digital assistant (PDA), a portable multimedia player (PMP), a navigation device, an ultra-mobile PC (UMPC), a television, a game console, a wrist watch type electronic device, a head-mounted display, a personal computer monitor, a laptop computer, a car dashboard, a digital camera, a camcorder, an external billboard, an electric billboard, various medical devices, various inspection devices, various home appliances including a display area such as a refrigerator or a washing machine, an Internet-of-Things (IoT) device, and the like. According to some aspects, the display device 1 is variously implemented as a smart phone, a tablet PC, a laptop computer, or the like.

According to some aspects, the display device 1 includes a display panel 10, a panel driving circuit 20, a circuit board 30, and a read-out circuit 40.

Figure 3:
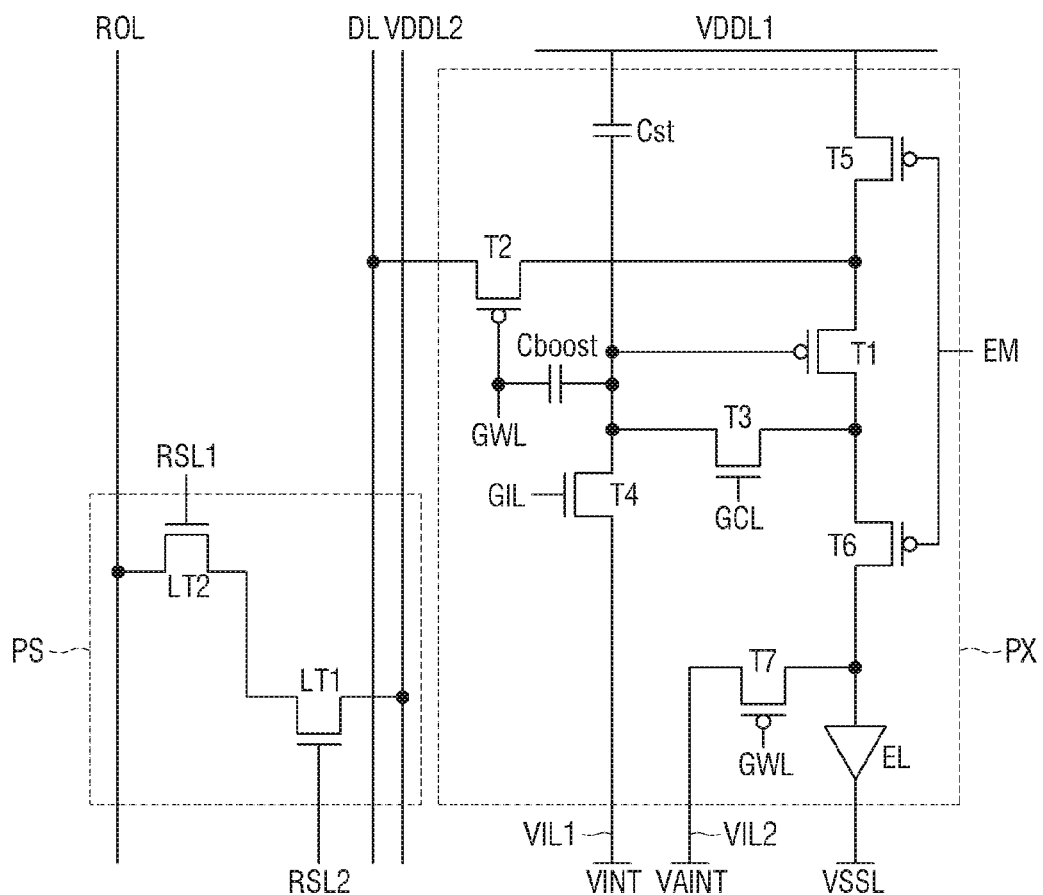
FIG. 3 is a detailed circuit diagram illustrating a pixel and an optical sensor according to at least one embodiment.

According to some aspects, the display panel 10 includes an active region AAR and a non-active region NAR. The active region AAR includes a display area DA for displaying at least one image. In an example, a plurality of pixels PX configured to display the at least one image are disposed in the display area DA. Referring to FIG. 3, at least one pixel PX includes a light emitting element EL. In at least one embodiment, the display area DA is coextensive with the active region AAR.

According to some aspects, the display area DA includes a fingerprint sensing area FSA. The fingerprint sensing area FSA is a region that reacts to light and is configured to sense an amount or a wavelength of incident light via a plurality of optical sensors PS included in the fingerprint sensor FSA. In an example, the fingerprint sensing area FSA is coextensive with the display area DA. In this case, the entire surface of the display area DA is therefore configured to sense or recognize fingerprints. In an example, only a portion of the display area DA includes the fingerprint sensing area FSA. In this case, only the portion of the display area DA that includes the fingerprint sensing area FSA is configured to sense or recognize fingerprints.

According to some aspects, the plurality of optical sensors PS that react to light are disposed in the fingerprint sensing area FSA. For example, at least one optical sensor PS includes a photosensitive material. Referring to FIG. 3, at least one optical sensor PS includes one or more transistors LT1, LT2, etc. configured to detect incident light and convert the incident light into an electrical signal.

According to some aspects, the non-active region NAR is disposed around the active region AAR. In at least one embodiment, the non-active region NAR is implemented as a bezel. In at least one embodiment, the non-active region NAR surrounds four sides of the active region AAR. In at least one embodiment, the non-active region surrounds more or less than four sides of the active region AAR.

According to some aspects, the panel driving circuit 20 is disposed in the non-active region NAR. In at least one embodiment, the panel driving circuit 20 drives the plurality of pixels PX and/or the plurality of optical sensors PS. In at least one embodiment, the panel driving circuit 20 drives the display panel 10 by outputting signals and voltages. In at least one embodiment, the panel driving circuit 20 is formed as an integrated circuit (IC) and is mounted on the display panel 10 or the circuit board 30. According to some aspects, first signal lines configured to transfer (e.g., transmit) signals between the panel driving circuit 20 and the active region AAR are disposed in the non-active region NAR.

According to some aspects, second signal lines configured to apply (e.g., transmit) a signal to the fingerprint sensing area FSA or to the read-out circuit 40 are disposed in the non-active region NAR. According to some aspects, the read-out circuit 40 is connected to at least one optical sensor PS through at least one of the second signal lines and detects a user's fingerprint input by receiving a current flowing from the at least one optical sensor PS through the at least one second signal line. In at least one embodiment, the read-out circuit 40 is formed as an integrated circuit (IC) and is attached on a display circuit board in a chip on film (COF) structure, or is attached on the non-active region NAR of the display panel 10 using a chip on glass (COG) method, a chip on plastic (COP) method, or an ultrasonic bonding method.

According to some aspects, the circuit board 30 is attached to one end of the display panel 10 using an anisotropic conductive film (ACF). In at least one embodiment, lead lines of the circuit board 30 are electrically connected to a pad portion of the display panel 10. In at least one embodiment, the circuit board 30 includes a flexible film and is implemented as a flexible printed circuit board or as a chip on film.

Figure 2:
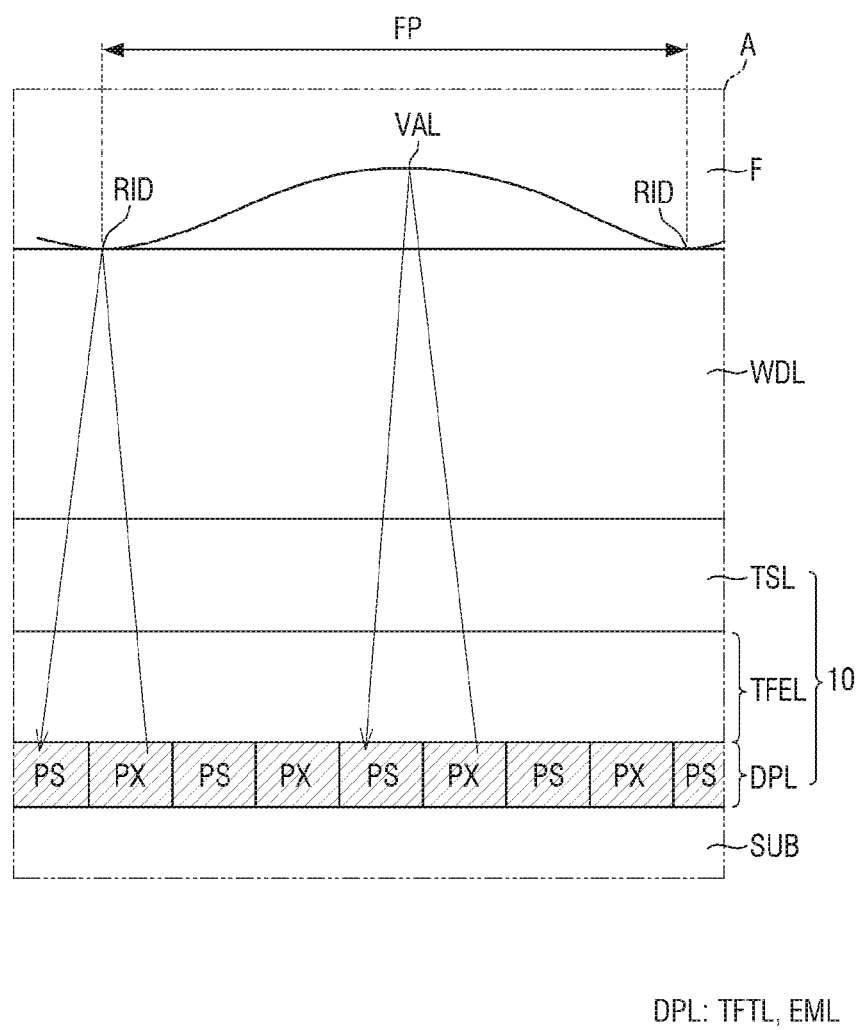
FIG. 2 is a schematic cross-sectional view illustrating an example of a fingerprint sensing process of a display device according to at least one embodiment.

FIG. 2 is a schematic cross-sectional view illustrating an example of a fingerprint sensing process of a display device according to at least one embodiment.

Referring to FIG. 2, according to some aspects, the display device 1 includes a substrate SUB, a display layer DPL, an encapsulation layer TFEL, a touch sensing layer TSL, and a window WDL. According to some aspects, the display layer DPL, the encapsulation layer TFEL, and the touch sensing layer TSL are included in the display panel 10. According to some aspects, the display layer DPL is disposed on the substrate SUB. In at least one embodiment, the display layer DPL includes a thin film transistor layer TFTL disposed on the substrate SUB and a light emitting element layer EML.

According to some aspects, the substrate SUB is a rigid substrate or is a flexible substrate configured to bend, fold, or roll. According to some aspects, the substrate SUB includes an insulating material such as glass, quartz, or a polymeric material such as a polymer resin. Examples of the polymeric material include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), or a combination thereof.

According to some aspects, the thin film transistor layer TFTL includes a plurality of thin film transistors, a plurality of display signal lines, and a plurality of sensing signal lines. According to some aspects, at least one display signal line of the plurality of display signal lines is configured to apply a signal for driving at least one pixel PX. For example, the at least one display signal line includes a scan line configured to transmit a scan signal to the least one pixel PX and a data line configured to transmit a data signal to the at least one pixel PX. According to some aspects, at least one sensor signal line of the plurality of sensing signal lines is configured to apply signals for driving at least one optical sensor PS. For example, the at least one sensor signal line includes a fingerprint scan line configured to transmit a fingerprint scan signal to the at least one optical sensor PS and a read-out line configured to detect a current generated in the at least one optical sensor PS.

According to some aspects, the light emitting layer EML is disposed on the thin film transistor TFTL. According to some aspects, the light emitting element layer EML includes the plurality of pixels PX and the plurality of optical sensors PS. According to some aspects, the plurality of pixels PX and the plurality of optical sensors PS are alternately arranged in a first horizontal direction (e.g., an X-axis direction) perpendicular to the vertical direction and/or a second horizontal direction (e.g., a Y-axis direction) perpendicular to the first horizontal direction and the vertical direction. For example, at least one optical sensor PS is disposed between proximate pairs of pixels PS and/or a pixel PX and a sidewall of the display layer DPL.

According to some aspects, at least one pixel PX includes a light emitting element described with reference to FIG. 3 that is configured to emit light in response to being driven by at least one thin film transistor and at least one display signal line of the thin film transistor layer TFTL. According to some aspects, at least one of the pixels PX includes an emission area configured to emit light of any one of a first color (for example, red), a second color (for example, green), and a third color (for example, blue). For example, in at least one embodiment, the light emitting element is included in the emission area. In at least one embodiment, the luminance of the light emitted by the emitting element EL is predetermined by an anode voltage and a cathode voltage applied from the thin film transistor layer TFTL.

According to some aspects, at least one of the optical sensors PS adjacent to the at least one pixel PX is configured to sense the light emitted from the emission area of the pixel PX, convert the light into an electrical signal, and output the electrical signal. In an example, the optical sensor PS senses the light via a sensing thin film transistor included in the optical sensor PS in response to being driven by at least one thin film transistor and at least one sensing signal line disposed in the thin film transistor layer TFTL.

In at least one embodiment, the sensing thin film transistor includes an oxide semiconductor. In an example, when the light emitted by the pixel PX is incident on the optical sensor PS, the optical sensor PS generates photocharges via a recombination of electrons and holes, and the generated photocharges generate a photocurrent.

According to some aspects, the encapsulation layer TFEL is disposed on the light emitting element layer EML. In at least one embodiment, the encapsulation layer TFEL includes a stacked layer of inorganic layers or organic layers configured to discourage moisture or oxygen from permeating the light emitting elements included in the light emitting element layer EML.

Figure 4:
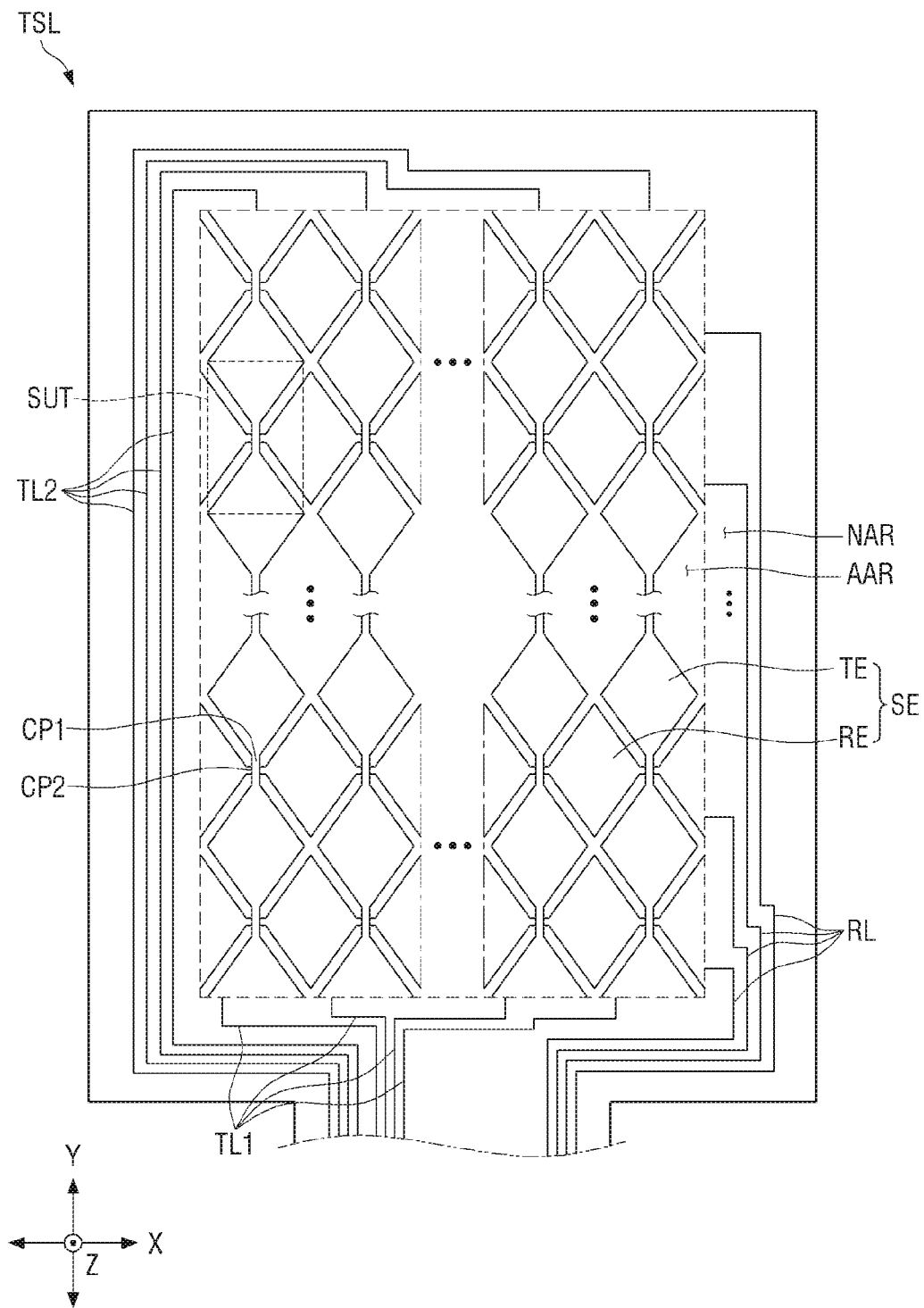
FIG. 4 is a plan view illustrating a touch sensing layer according to at least one embodiment.

According to some aspects, the touch sensing layer TSL is disposed on the encapsulation layer TFEL. Referring to FIG. 4, in at least one embodiment, the touch sensing layer TSL includes a plurality of sensing signal lines TL and RL and a plurality of touch electrodes SE configured to sense the user's touch using a self-capacitance scheme or a mutual capacitance scheme.

According to some aspects, the window WDL is disposed on the touch sensing layer TSL. In at least one embodiment, the window WDL includes a rigid material such as glass or quartz. In at least one embodiment, the window WDL includes a window member. In at least one embodiment, the window WDL is attached to the touch sensing layer TSL via an optically clear adhesive or the like.

According to some aspects, a polarizing film described with reference to FIG. 15 that is configured to reduce external light reflection is disposed between the touch sensing layer TSL and the window WDL. According to some aspects, a color filter described with reference to FIG. 16 and a light-blocking layer described with reference to FIG. 16 are disposed between the touch sensing layer TSL and the window WDL.

FIG. 2 is a cross-sectional view illustrating a state in which a user's fingerprint F is in contact with the window WDL of the display device. In some embodiments, the fingerprint F includes ridges RID and valleys VAL disposed between the ridges RID. In an example, when the fingerprint F is in contact with the top surface of the window WDL, at least one ridge RID contacts a top surface of the window WDL and at least one valley VAL does not contact with the window WDL. For example, the top surface of the window WDL is in contact with air disposed beneath the valley VAL portion.

In at least one embodiment, when the fingerprint F contacts the top surface of the window WDL, light output from the light-emitting element described with reference to FIG. 3 of at least one pixel PX is reflected from the ridges RID and the valley VAL of the fingerprint F. In this case, as the refractive index of the fingerprint F and the refractive index of the air are different from each other, the amount of light reflected from the ridges RID may be different from the amount of the light reflected from the valley VAL. Accordingly, at least one optical sensor PS detects the ridges RID and the valley VAL of the fingerprint F based on a difference in the amount of light reflected from portions of the fingerprint F onto the optical sensor PS. As the optical sensor PS outputs electrical signals according to the different amount of light or photocurrent incident on the optical sensor PS, the optical sensor PS therefore is able to identify the pattern of the fingerprint F, where the pattern includes one or more ridges and one or more valleys. According to some aspects, multiple optical sensors PS combine to detect a pattern of an area of the fingerprint F or the pattern of the entire fingerprint F.

A width FP between ridges RID of the finger or a width between valleys VAL of the fingerprint F may range from about 100 µm to about 150 µm. A width between adjacent optical sensors PS spaced apart from each other may be smaller than the width FP. Accordingly, embodiments of the present disclosure may increase an accuracy of user fingerprint recognition.

FIG. 2 illustrates an embodiment in which the plurality of pixels PX and the plurality of optical sensors PS are alternately arranged. However, according to some aspects, the layout of the pixels PX and the optical sensors PS may be variously modified according to a resolution of the display panel 10, a thickness and material of the window WDL on the display panel 10, and so forth. For example, in order to increase the resolution of the display panel 10, the plurality of optical sensors PS may be disposed in only a portion of the display panel 10.

FIG. 3 is a detailed circuit diagram illustrating a pixel and an optical sensor according to at least one embodiment. FIG. 3 illustrates an embodiment in which one pixel PX and one optical sensor PS are integrated in a circuit structure of the display panel 10.

Referring to FIG. 3, at least one pixel PX includes a plurality of transistors, a light emitting element EL, and at least one capacitor. In at least one embodiment, the plurality of transistors includes first to seventh transistors T1, T2, T3, T4, T5, T6, and T7, where the first transistor T1 is a driving transistor and the second to seventh transistors T2 to T7 are transistors implemented as switch elements that are configured to turn on or off in response to scan signals applied to gate electrodes included in the second to seventh transistors T2 to T7. In at least one embodiment, the pixel PX includes a storage capacitor Cst and a boost capacitor Cboost.

According to some aspects, the at least one pixel PX is connected to a scan initialization line GIL, a scan control line GCL, a scan write line GWL, an emission line EM, and a data line DL. According to some aspects, the at least one pixel PX is connected to a first driving voltage line VDDL1 through which a driving voltage is applied, a common voltage line VSSL through which a common voltage is applied, a first initialization voltage line VIL1 through which a first initialization voltage $V_{INT}$ is applied, and a second initialization voltage line VIL2 through which a second initialization voltage $V_{AINT}$ is applied.

According to some aspects, the display device described with reference to FIG. 1 includes a scan driver. According to some aspects, the scan driver is connected to the scan write line GWL, the scan write line GCL, and the scan initialization line GIL. In at least one embodiment, the scan driver transmits the scan signal to the second transistor T2 via the scan write line GWL. In at least one embodiment, the scan driver transmits a scan control signal to the third transistor T3 via the scan control line GCL. In at least one embodiment, the scan driver simultaneously applies a scan signal having a first voltage to the scan write line GWL and a scan control signal having a second voltage to the scan control line GCL, where the first voltage and the second voltage have opposite polarities from each other. For example, when a high voltage is applied to the scan write line GWL, a low voltage is applied to the scan control line GCL. In at least one embodiment, the scan driver transmits a scan initialization signal to the fourth transistor T4 via the scan initialization line GIL.

According to some aspects, the scan driver may transmit an emission signal to at least one of the fifth transistor T5 and the sixth transistor T6 via the emission line EM. According to some aspects, the display device described with reference to FIG. 1 includes a data driver connected to the data line DL. In at least one embodiment, the data driver generates a data voltage and transmits the data voltage to the at least one pixel PX via the data line DL. According to some aspects, the luminance of the light output by the light emitting element EL varies according to the data voltage applied to the at least one pixel PX.

According to some aspects, a power supply voltage source may output the driving voltage to the at least one pixel PX via the first driving voltage line VDDL1. According to some aspects, the power supply voltage source may output the common voltage to a cathode electrode of the light emitting element EL via the common voltage line VSLL. In at least one embodiment, the driving voltage is a high potential voltage for driving the light emitting element EL, and the common voltage is a low potential voltage for driving the light emitting element EL. For example, in at least one embodiment, the driving voltage has a higher potential than the common voltage. According to some aspects, the power supply voltage source may output the first initialization voltage $V_{INT}$ to the first initialization voltage line VIL1. According to some aspects, the power supply voltage source may output the second initialization voltage $V_{AINT}$ to the second initialization voltage line VIL2. In at least one embodiment, each of the driving voltage, the first initialization voltage $V_{INT}$, the second initialization voltage $V_{AINT}$, and the common voltage is a constant voltage.

Hereinafter, the structure of the plurality of transistors and the connections between transistors of the plurality of transistors will be described in detail.

According to some aspects, the first transistor T1 is implemented as a P-type transistor and includes a polycrystalline semiconductor. In at least one embodiment, the first transistor T1 includes a gate electrode, a first electrode, and a second electrode. According to some aspects, the first transistor T1 controls a source-drain current $I_{sd}$ (hereinafter referred to as a "driving current $I_{sd}$") according to a data voltage applied to the gate electrode. In at least one embodiment, the driving current $I_{sd}$ flowing through a channel of the first transistor T1 is proportional to the square of a difference between a source-gate voltage (a voltage between the source electrode and the gate electrode of the first transistor T1) and an absolute value of a threshold voltage $V_{th}$:

$$I_{sd}=k'\times(V_{sg}-|V_{th}|)^2 \quad (1)$$

In Eq. 1, k' denotes a proportional coefficient determined by the structure and physical characteristics of the first transistor T1, $V_{sg}$ denotes the source-gate voltage of the first transistor T1, and $V_{th}$ represents the threshold voltage of the first transistor T1.

According to some aspects, the gate electrode of the first transistor T1 is connected to a first electrode of the third transistor T3 and an electrode of the storage capacitor Cst. According to some aspects, the first electrode of the first transistor T1 is connected to a second electrode of the second transistor T2 and a second electrode of the fifth transistor T5. According to some aspects, the second electrode of the first transistor T1 is connected to a second electrode of the third transistor T3 and a first electrode of the sixth transistor T6.

In at least one embodiment, the light emitting element EL emits light in response to the driving current $I_{sd}$, and an amount of light emitted by the light emitting element EL is proportional to the driving current $I_{sd}$.

Figure 12:
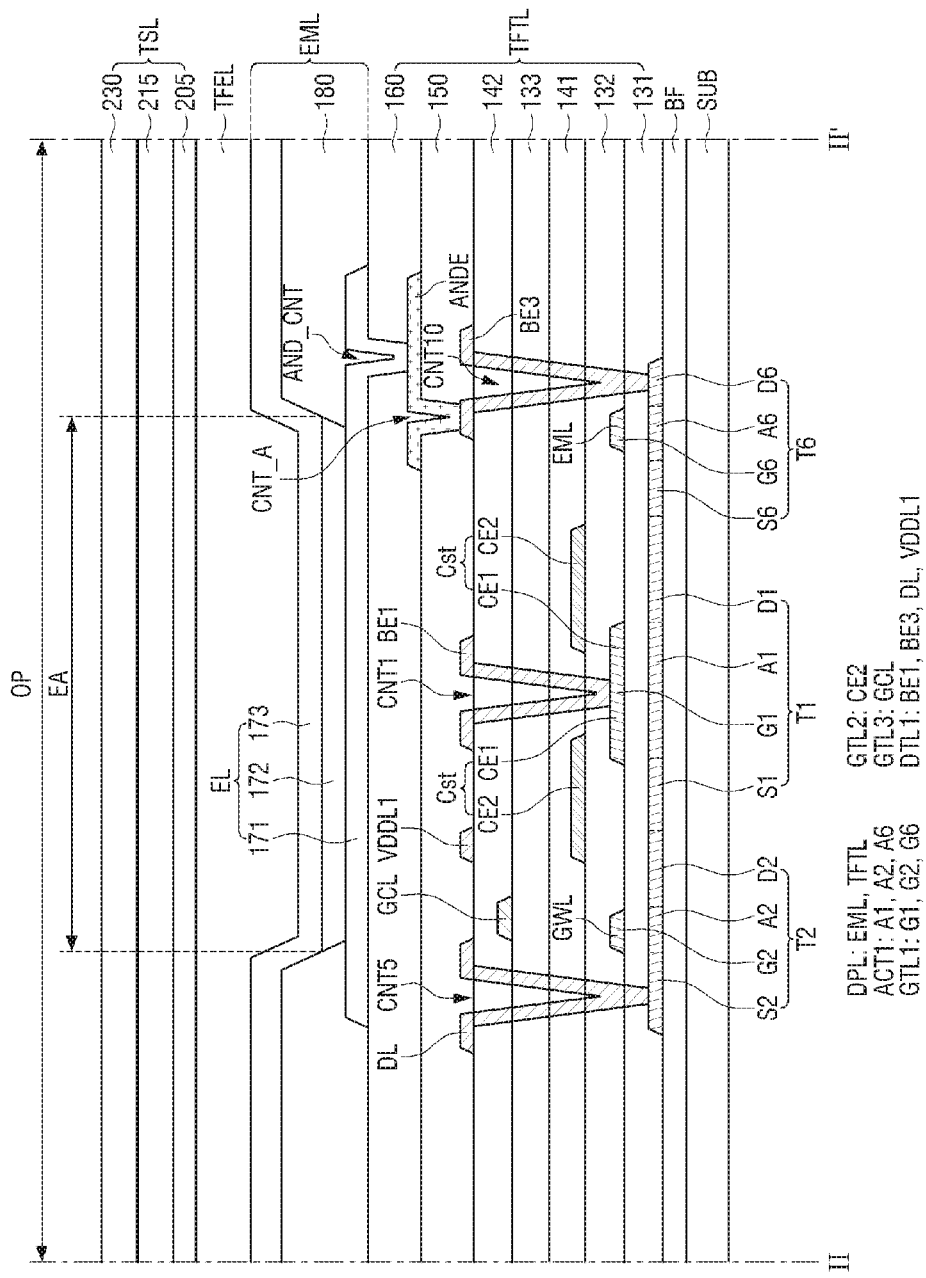
FIG. 12 is a cross-sectional view taken along line II-IT of FIGS. 10 and 11.

In at least one embodiment, the light emitting element EL is an organic light emitting diode including an anode electrode, a cathode electrode, and an organic light emitting layer disposed between the anode electrode and the cathode electrode. In at least one embodiment, the light emitting element EL is an inorganic light emitting element including an anode electrode, a cathode electrode, and an inorganic semiconductor disposed between the anode electrode and the cathode electrode. In at least one embodiment, the light emitting element EL is a quantum dot light emitting element including an anode electrode, a cathode electrode, and a quantum dot light emitting layer disposed between the anode electrode and the cathode electrode. In at least one embodiment, the light emitting element EL is a micro light emitting diode. Referring to FIG. 12, the anode electrode of the light emitting element EL corresponds to a pixel electrode 171, and the cathode electrode thereof corresponds to a common electrode 173.

According to some aspects, the anode electrode of the light emitting element EL is connected to a second electrode of the sixth transistor T6 and a second electrode of the seventh transistor T7, and the cathode electrode of the light emitting element EL is connected to the common driving voltage line VSSL.

According to some aspects, the second transistor T2 is implemented as a P-type transistor and includes a polycrystalline semiconductor. In at least one embodiment, the second transistor T2 turns on in response to receiving the scan signal from the scan write line GWL, and the first electrode of the first transistor T1 to the data line DL are thereby connected. In at least one embodiment, a gate electrode of the second transistor T2 is connected to the scan write line GWL, a first electrode of the second transistor T2 is connected to the data line DL, and the second electrode of the second transistor T2 is connected to the first electrode of the first transistor T1.

According to some aspects, the third transistor T3 is implemented as an N-type transistor, and includes an oxide semiconductor. In at least one embodiment, the third transistor T3 turns on in response to receiving the scan signal from the scan control line GCL, and the gate electrode and the second electrode of the first transistor T1 are thereby connected. For example, when the third transistor T3 turns on, the gate electrode and the second electrode of the first transistor T1 connect, and the first transistor T1 is therefore driven as a diode. According to some aspects, a gate electrode of the third transistor T3 is connected to the scan control line GCL, the first electrode of the third transistor T3 is connected to the second electrode of the first transistor T1, and a second electrode of the third transistor T3 may be connected to the gate electrode of the first transistor T1.

According to some aspects, the fourth transistor T4 is implemented as an N-type transistor, and includes an oxide semiconductor. In at least one embodiment, the fourth transistor T4 turns on in response to receiving the scan signal from the scan initialization line GIL, and the gate electrode of the first transistor T1 is thereby connected to the first initialization voltage line VIL1. In this case, the gate electrode of the first transistor T1 is discharged to the first initialization voltage $V_{INT}$ of the first initialization voltage line VIII. In at least one embodiment, a gate electrode of the fourth transistor T4 is connected to the scan initialization line GIL, and a first electrode and a second electrode of the fourth transistor T4 is connected to the first initialization voltage line VIL1 and the gate electrode of the first transistor T1, respectively.

According to some aspects, the fifth transistor T5 is implemented as a P-type transistor, and includes a polycrystalline semiconductor. In at least one embodiment, the fifth transistor T5 turns on in response to receiving an emission signal from the emission line EM, and the first electrode of the first transistor T1 is thereby connected to the first driving voltage line VDDL1. In at least one embodiment, a gate electrode of the fifth transistor T5 is connected to the emission line EM, a first electrode of the fifth transistor T5 is connected to the first driving voltage line VDDL1, and a second electrode of the fifth transistor T5 is connected to the first electrode of the first transistor T1.

According to some aspects, the sixth transistor T6 is implemented as a P-type transistor, and includes a polycrystalline semiconductor. In at least one embodiment, the sixth transistor T6 turns on in response to receiving the emission signal from the emission line EM, and the second electrode of the first transistor T1 is thereby connected to the anode electrode of the light emitting element EL. In at least one embodiment, the gate electrode of the sixth transistor T6 is connected to the emission line EM, a first electrode of the sixth transistor T6 is connected to the second electrode of the first transistor T1, and a second electrode of the sixth transistor T6 is connected to the anode electrode of the light emitting element EL.

According to some aspects, when both the fifth transistor T5 and the sixth transistor T6 turn on, the driving current $I_{sd}$ is supplied to the light emitting element EL.

According to some aspects, the seventh transistor T7 is implemented as a P-type transistor, and includes a polycrystalline semiconductor. In at least one embodiment, the seventh transistor T7 turns on in response to receiving the scan signal from the scan write line GWL, and the second initialization voltage line VIL2 is thereby connected to the anode electrode of the light emitting element EL. In this case, the anode electrode of the light emitting element EL is discharged to the second initialization voltage $V_{AINT}$. In at least one embodiment, a gate electrode of the seventh transistor T7 is connected to the scan write line GWL, a first electrode of the seventh transistor T7 is connected to the second initialization voltage line VIL2, and a second electrode of the seventh transistor T7 is connected to the anode electrode of the light emitting element EL.

According to some aspects, the storage capacitor Cst is formed between the gate electrode of the first transistor T1 and the first driving voltage line VDDL1. In at least one embodiment, a first electrode of the storage capacitor Cst is connected to the gate electrode of the first transistor T1, and a second electrode of the storage capacitor Cst is connected to the first driving voltage line VDDL1. Accordingly, the storage capacitor Cst maintains a potential difference between the gate electrode of the first transistor T1 and the first driving voltage line VDDL1.

In at least one embodiment, a first electrode of the boost capacitor Cboost is connected to the gate electrode of the first transistor T1 and the second electrode of the third transistor T3, and a second electrode of the boost capacitor Cboost is connected to the scan write line GWL. In at least one embodiment, the boost capacitor Cboost is formed between the scan write line GWL and the gate electrode of the first transistor T1 such that a gate voltage of the first transistor T1 is increased, allowing the first transistor T1 to stably output a black voltage. For example, in at least one embodiment, a low voltage is supplied from the scan control line GCL when a high voltage is applied to the scan write line GWL, and a high voltage is supplied from the scan control line GCL when a low voltage is applied to the scan write line GWL. Therefore, the boost capacitor Cboost is configured to increase the gate voltage of the first transistor T1 such that the first transistor T1 stably outputs the black voltage. The light emitting element does not emit when the black voltage is applied to the first electrode of the light emitting element.

In at least one embodiment, the first electrode of each of the first to seventh transistors T1, T2, T3, T4, T5, T6, and T7 is a source electrode, and the second electrode of each of the first to seventh transistors T1 to T7 is a drain electrode. In at least one embodiment, the first electrode of each of the first to seventh transistors T1, T2, T3, T4, T5, T6, and T7 is a drain electrode, and the second electrode of each of the first to seventh transistors T1 to T7 is a source electrode.

In the example shown in FIG. 3, the first transistor T1, the second transistor T2, the fifth transistor T5, the sixth transistor T6, and the seventh transistor T7 are P-type transistors formed of a polycrystalline semiconductor such as polysilicon or amorphous silicon, and the third transistor T3 and the fourth transistor T4 are N-type transistors formed of, for example, an oxide semiconductor. In an example, at least one of the second transistor T2, the fifth transistor T5, the sixth transistor T6, or the seventh transistor T7 may include an oxide semiconductor.

According to some aspects, the at least one optical sensor PS includes a plurality of sensing transistors. In at least one embodiment, the plurality of sensing transistors includes a light-sensing transistor LT1 configured to sense incident light and a sensing switch transistor LT2 configured to output sensing data from the light-sensing transistor LT1. In at least one embodiment, the light-sensing transistor LT1 and the sensing switch transistor LT2 are connected in series to each other. In at least one embodiment, the plurality of sensing transistors turn on or off in response to receiving sensing scan signals via gate electrodes of the plurality of sensing transistors.

According to some aspects, the at least one optical sensor PS is connected to a first sensing scan line RSL1, a second sensing scan line RSL2, a second driving voltage line VDDL2 to which a second driving voltage is applied, and a read-out line ROL.

According to some aspects, the display device described with reference to FIG. 1 includes a sensing scan driver connected to the first sensing scan line RSL1 and the second sensing scan line RSL2. In at least one embodiment, the sensing scan driver transmits a first sensing scan signal to the sensing switch transistor LT2 via the first sensing scan line RSL1. In at least one embodiment, the sensing scan driver transmits a second sensing scan signal to the light-sensing transistor LT2 via the second sensing scan line RSL2.

According to some aspects, the sensing scan driver and the scan driver are implemented as one component of the display device described with reference to FIG. 1. According to some aspects, the sensing scan driver and the scan driver are implemented as separate components of the display device. In at least one embodiment, the sensing scan driver is configured to supply the sensing scan signals to the at least one optical sensor PS independently of the scan driver applying the scan signal to the at least one pixel PX. In at least one embodiment, the sensing scan driver is configured to supply the sensing scan signals to the at least one optical sensor PS at the same time as the scan driver applies the scan signal to the at least one pixel PX.

According to some aspects, the second driving voltage line VDDL2 applies a driving voltage to the at least one optical sensor PS. In at least one embodiment, the driving voltage is a high potential voltage for driving the optical sensor PS, and the second driving voltage line VDDL2 is formed of a wire that is spaced apart from the first driving voltage line VDDL1. In at least one embodiment, the second driving voltage line VDDL2 and the first driving voltage line VDDL1 are implemented together as one component.

According to some aspects, the read-out line ROL transfers a current signal that flows in response to the photocharges generated by the at least one optical sensor PS to the read-out circuit described with reference to FIG. 1. In at least one embodiment, the read-out circuit identifies the user's fingerprint pattern by measuring the amount of the current flowing in one or more read-out lines ROL included in the display device described with reference to FIG. 1.

According to some aspects, the light-sensing transistor LT1 is an amplifying transistor that generates a drain-source current in response to receiving light. In at least one embodiment, the light-sensing transistor LT1 turns on in response to receiving the second sensing scan signal of the second sensing scan line RSL2 via a gate electrode of the light-sensing transistor LT1, and the second driving voltage line VDDL2 is thereby connected to a second electrode of the second sensing switch transistor LT2. Accordingly, a drain-source current may be accumulated in the second electrode of the sensing switch transistor LT2.

In at least one embodiment, the light-sensing transistor LT1 is implemented as an N-type transistor including a semiconductor layer that includes a light-sensitive oxide semiconductor material, and the light-sensing transistor LT1 is configured to sense external light via the light-sensitive oxide semiconductor material. For example, a semiconductor layer of the light-sensing transistor LT1 generates a photocurrent by sensing light incident from the outside.

According to some aspects, the sensing switch transistor LT2 is a switch transistor having constant electrical characteristics regardless of an application of light to the sensing switch transistor LT2. In at least one embodiment, the sensing switch transistor LT2 turns on in response to receiving the first sensing scan signal of the first sensing scan line RSL1 via the gate electrode of the sensing switch transistor LT2, and a first electrode of the light-sensing transistor LT1 is thereby connected to the read-out line ROL. In this case, the drain-source current generated by the light-sensing transistor LT1 is transferred to the read-out circuit described with reference to FIG. 1 through the read-out line ROL.

In at least one embodiment, the sensing switch transistor LT2 is implemented as an N-type transistor including an oxide semiconductor material. In at least one embodiment, the sensing switch transistor LT2 is implemented as a P-type transistor formed of polysilicon or amorphous silicon. According to some aspects, the sensing switch transistor LT2 includes a material that is not sensitive to light, thereby reducing a possible instability of electrical characteristics that might be caused by light that is received from the rear surface of the substrate described with reference to FIG. 12.

In at least one embodiment, the first electrodes of each of the light-sensing transistor LT1 and the sensing switch transistor LT2 are source electrodes, and the second electrodes of each of the light-sensing transistor LT1 and the sensing switch transistor LT2 are drain electrodes. In at least one embodiment, the first electrodes of the light-sensing transistor LT1 and the sensing switch transistor LT2 are drain electrodes, and the second electrodes of each of the light-sensing transistor LT1 and the sensing switch transistor LT2 are source electrodes.

FIG. 4 is a plan view illustrating a touch sensing layer according to at least one embodiment. Referring to FIG. 4, the touch sensing layer TSL includes a touch sensing region configured to sense a user's touch and a touch peripheral region disposed around the touch sensing region. In at least one embodiment, the touch sensing region corresponds to the active region AAR described with reference to FIG. 1, and the touch peripheral region corresponds to the non-active region NAR described with reference to FIG. 1.

According to some aspects, the active region AAR includes a plurality of touch electrodes SE. In at least one embodiment, the plurality of touch electrodes SE includes two types of electrodes, such as driving electrodes TE and sensing electrodes RE, and after a touch driving signal is applied to the driving electrodes TE, a charge variation of mutual capacitance of a unit sensing region SUT is detected through at least one sensing electrode RE. Alternatively, in at least one embodiment, the plurality of touch electrodes SE include one type of electrodes, and at least one touch electrode SE recognizes a touch according to a self-capacitance scheme. Hereinafter, mutual capacitance type touch members will mainly be described.

According to some aspects, the touch sensing layer TSL includes the plurality of driving electrodes TE, the plurality of sensing electrodes RE, a plurality of driving lines TL, and a plurality of sensing lines RL.

In at least one embodiment, driving electrodes of the plurality of driving electrodes TE are electrically connected to each other in the second horizontal direction (the Y-axis direction) and are spaced apart from each other in the first horizontal direction (the X-axis direction). In at least one embodiment, driving electrodes TE that are adjacent to each other in the second horizontal direction (the Y-axis direction) are connected to each other via first connectors CP1. In at least one embodiment, sensing electrodes of the plurality of sensing electrodes RE are electrically connected to each other in the first horizontal direction (the X-axis direction) and are spaced apart from each other in the second horizontal direction (the Y-axis direction). In at least one embodiment, sensing electrodes RE that are adjacent to each other in the first horizontal direction (the X-axis direction) are connected to each other via second connectors CP2.

According to some aspects, the plurality of driving electrodes TE and the first connectors CP1 are disposed in different touch-conductive layers of the touch sensing layer TSL than the plurality of sensing electrodes RE and the second connectors CP2, and intersections of the plurality of driving electrodes TE, the first connectors CP1, the plurality of sensing electrodes RE, and the second connectors CP2 are electrically insulated.

According to some aspects, the plurality of sensing signal lines TL and RL are disposed in the non-active region NAR. According to some aspects, the plurality of sensing signal lines TL and RL include a plurality of driving lines TL connected to the plurality of driving electrodes TE and a plurality of sensing lines RL connected to the plurality of sensing electrodes RE.

According to some aspects, the plurality of driving lines TL includes first driving lines TL1 connected to driving electrodes of the plurality of driving electrodes TE disposed at one end of the touch sensing layer TSL and second driving lines TL2 connected to driving electrodes TE of the plurality of driving electrodes TE disposed at the other end of the touch sensing layer TSL. In an example, the first driving lines TL1 are connected to driving electrodes TE disposed in a lower side of the active region AAR in terms of the second horizontal direction (the Y-axis direction), and the second driving lines TL2 are connected to driving electrodes TE disposed in an upper side of the active region AAR in terms of the second horizontal direction (the Y-axis direction). In this case, the second driving lines TL2 may be disposed in a right or a left edge of the active region AAR in terms of the first horizontal direction (the X-axis direction). In at least one embodiment, the first driving lines TL1 and the second driving lines TL2 are connected to a touch driving circuit through a touch pad.

According to some aspects, the plurality of sensing lines RL are connected to sensing electrodes RE of the plurality of sensing electrodes RE disposed at one end of the touch sensing layer TSL. In at least one embodiment, the sensing lines RL are connected to the touch driving circuit through the touch pad.

According to some aspects, the touch electrodes SE are driven by a mutual capacitance scheme. For example, mutual capacitances formed at intersections between the sensing electrodes RE and the driving electrodes TE are charged in response to driving signals that are supplied to the driving electrodes TE via the first driving lines TL1 and the second driving lines TL2. Then, a variation of a charge amount of the sensing electrodes RE is measured through the sensing lines RL, and a presence or absence of a touch input is determined based on the variation of the charge amount of the sensing electrodes RE.

Figure 5:
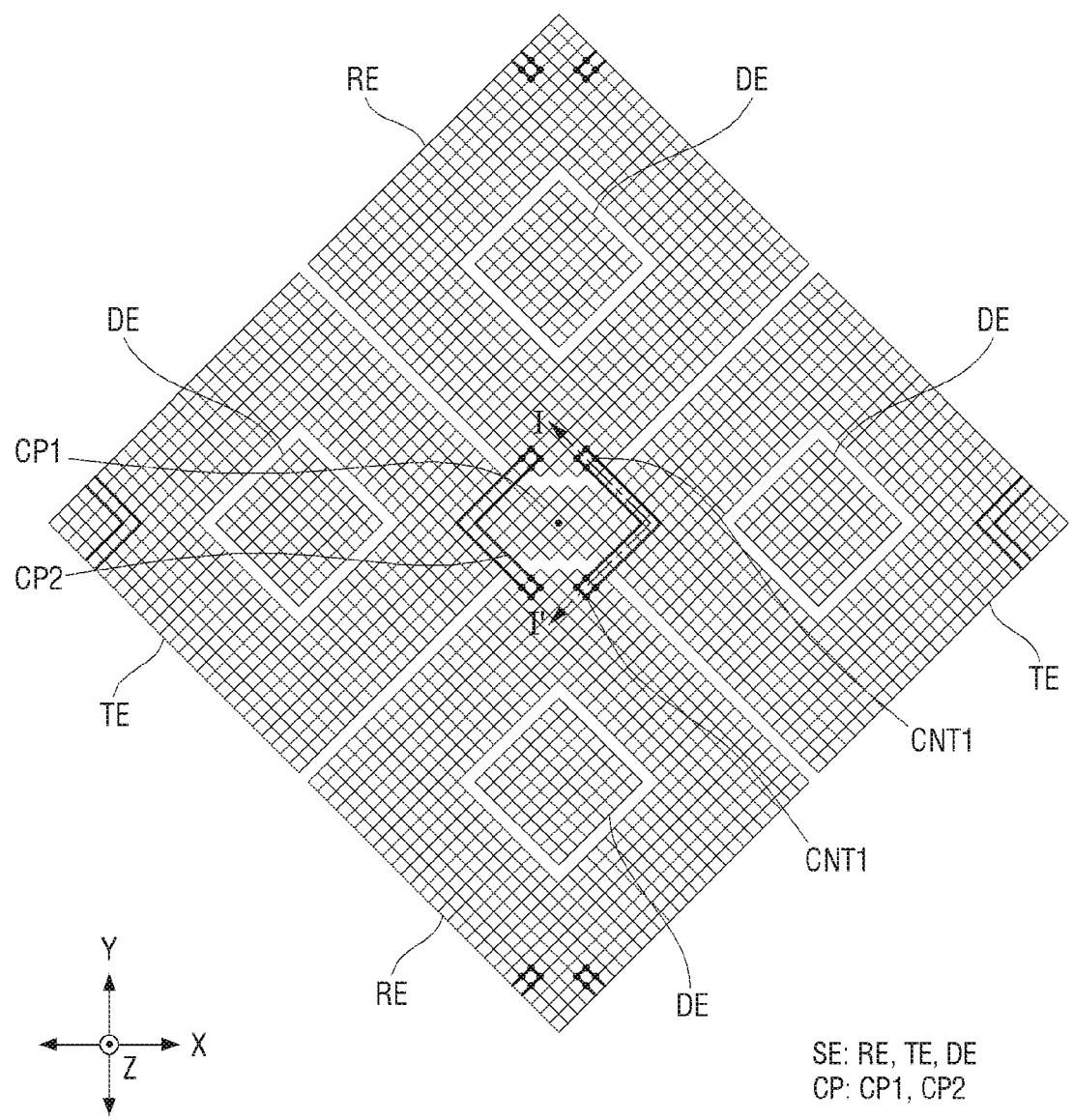
FIG. 5 is a plan view illustrating a mesh structure of touch electrodes according to at least one embodiment.
Figure 6:
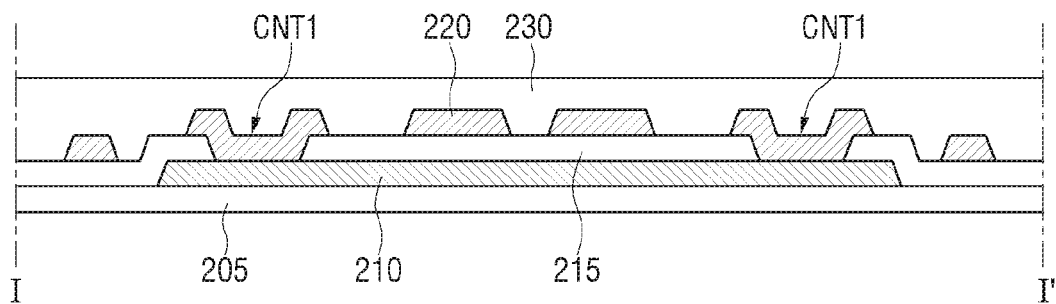
FIG. 6 is a cross-sectional view taken along line I-I' of FIG. 5.

Hereinafter, the plan layout and the cross-sectional structure of the touch electrodes SE will be described with reference to FIGS. 5 and 6. FIG. 5 is a plan view illustrating a mesh structure of touch electrodes according to at least one embodiment. FIG. 6 is a cross-sectional view taken along line I-I' of FIG. 5.

In FIG. 5, for simplicity of description, only a proximate pair of sensing electrodes RE adjacent in the first direction (X-axis direction) and only a proximate pair of driving electrodes TE adjacent in the second direction (Y-axis direction) of the touch sensing layer TSL are illustrated. Referring to FIG. 5, according to some aspects, the touch electrodes SE further include one or more dummy patterns DE, where each dummy pattern DE is surrounded by a driving electrode TE or a sensing electrode RE. In at least one embodiment, the driving electrodes TE, the sensing electrodes RE, and the dummy patterns DE are electrically isolated from each other. In at least one embodiment, the driving electrodes TE, the sensing electrodes RE, and the dummy patterns DE are spaced apart from each other.

According to some aspects, driving electrodes TE disposed adjacent to each other in the second horizontal direction (the Y-axis direction) are connected through the first connector CP1, and sensing electrodes RE adjacent to each other in the first horizontal direction (the X-axis direction) are connected through the second connector CP2, thereby electrically isolating the sensing electrodes RE from the driving electrodes TE at their intersections. In at least one embodiment, the first connector CP1 is formed in a layer different from a layer in which the sensing electrodes RE and the driving electrodes TE are disposed and is connected to the driving electrodes TE through first contact holes CNT1, thereby increasing the insulation at intersections of the sensing electrodes RE and the driving electrodes TE.

According to some aspects, the driving electrodes TE, the sensing electrodes RE, the first connectors CP1, and the second connectors CP2 are formed in a mesh structure or in a net structure. According to some aspects, the dummy patterns DE are also formed in a mesh structure or in a net structure.

When the touch sensing layer TSL including the touch electrodes SE is formed directly on top of the encapsulation layer TFEL, a parasitic capacitance may be formed between the common electrode 173 of the light emitting element layer EML and the touch electrodes SE. In at least one embodiment, as the parasitic capacitance is proportional to the overlapping area between the common electrode 173 and the touch electrodes SE, the parasitic capacitance is reduced by forming the touch electrodes SE in the mesh structure or in the net structure.

Referring to FIG. 6, according to some aspects, the touch sensing layer TSL includes a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

For example, in at least one embodiment, the first touch conductive layer 210 is disposed on the base layer 205, the first touch conductive layer 210 is covered by the first touch insulating layer 215, the first touch insulating layer 215 insulates the first touch conductive layer 210 from the second touch conductive layer 220, the second touch conductive layer 220 is disposed on the first touch insulating layer 215, and the second touch insulating layer 230 protects the second touch conductive layer 220 by covering the second touch conductive layer 220.

According to some aspects, the base layer 205 includes an inorganic insulating material. In an example, the base layer 205 includes a silicon nitride layer, a silicon oxynitride layer, a silicon oxide layer, a titanium oxide layer, an aluminum oxide layer, or the like. In at least one embodiment, the base layer 205 is an inorganic layer included in a thin film encapsulation layer.

In at least one embodiment, the first connector CP1 is formed of the material of first touch conductive layer 210, and the driving electrode TE, the sensing electrode RE, and the second connector CP2 is formed of the material of the second touch conductive layer 220, where the second touch conductive layer 220 is disposed on the first touch conductive layer 210 and the first touch insulating layer 215 is disposed between the first touch conductive layer 210 and the second touch conductive layer 220. In this case, mutual insulation may be achieved where a driving electrode TE and a sensing electrode RE intersect. In at least one embodiment, the second connector CP2 is formed of the first touch conductive layer 210, and the driving electrode TE, the sensing electrode RE, and the first connector CP1 are formed of the second touch conductive layer 220.

In at least one embodiment, the touch electrodes SE are arranged in the mesh structure, and each of the first touch conductive layer 210 and the second touch conductive layer 220 includes one or more low-resistance materials such as aluminum (Al), molybdenum (Mo), gold (Au), titanium (Ti), nickel (Ni), or copper (Cu).

According to some aspects, each of the first touch insulating layer 215 and the second touch insulating layer 230 includes an inorganic insulating material or an organic insulating material. In at least one embodiment, one of the first touch insulating layer 215 and the second touch insulating layer 230 includes an inorganic material, and the other includes an organic material.

According to some aspects, the first touch insulating layer 215 includes the first contact hole CNT1. In at least one embodiment, the first touch conductive layer 210 (for example, the first connector CP1 and a portion of the second touch conductive layer 220, such as the driving electrode TE) is electrically connected through the first contact hole CNT1.

According to some aspects, because the touch electrodes SE are implemented in the mesh structure, the second touch conductive layer 220 constituting the touch electrodes SE is disposed on a non-emission area of the display panel. As the second touch conductive layer 220 is disposed on the non-emission area, the second touch conductive layer 220 does not hamper light emission, even when the second touch conductive layer 220 includes an opaque low-resistance metal, and the second touch conductive layer 220 may not be recognized by a user.

Hereinafter, an arrangement of the mesh structure of the plurality of pixels PX of the display layer DPL and the touch electrodes SE of the touch sensing layer TSL according to at least one embodiment will be described.

Figure 7:
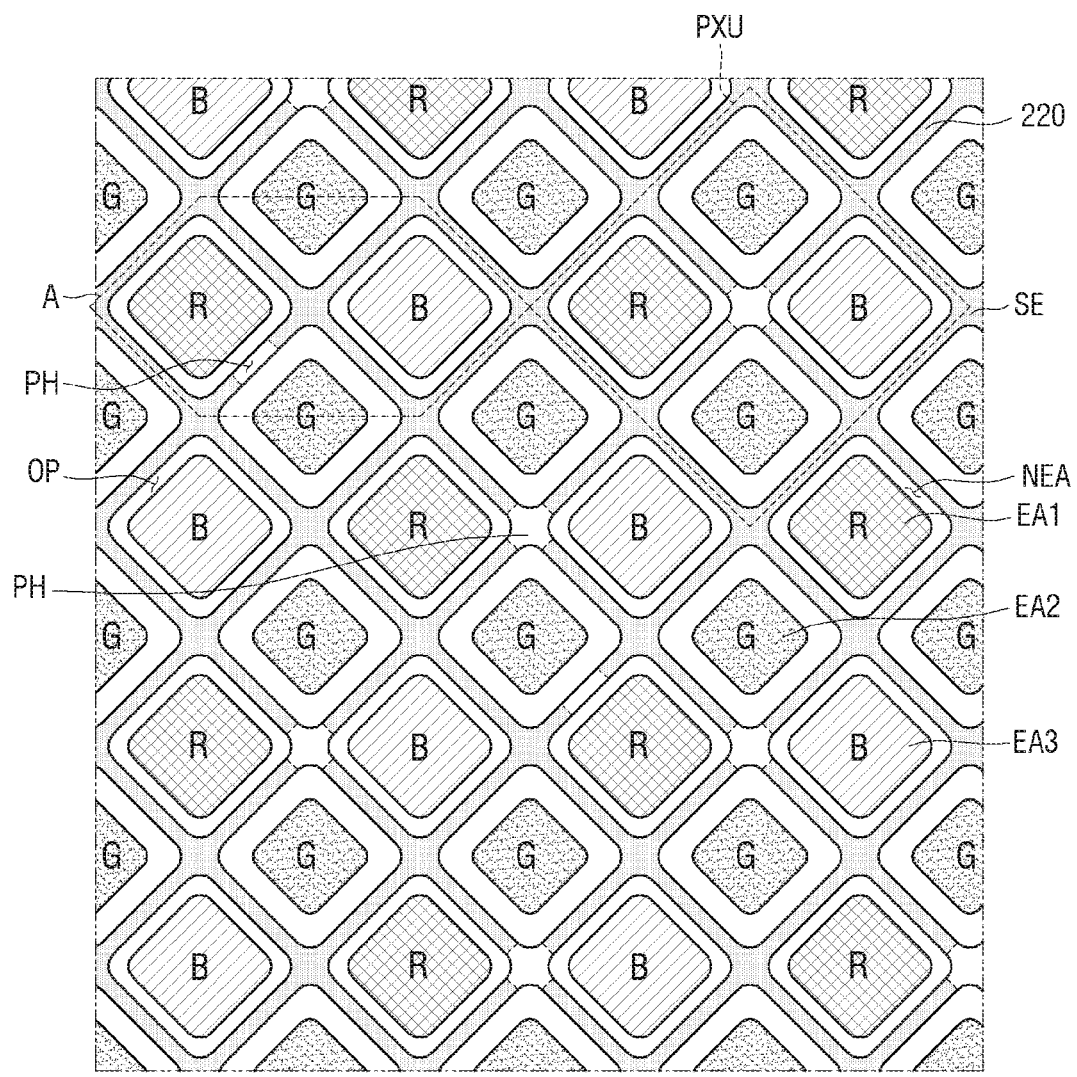
FIG. 7 is a plan layout view of a mesh structure of pixels and touch electrodes according to at least one embodiment.

FIG. 7 is a plan layout view of a mesh structure of pixels and touch electrodes according to at least one embodiment. Referring to FIG. 7, according to some aspects, the plurality of pixels PX include first color pixels R, second color pixels G, and third color pixels B. In an example, the first color is red, the second color is green, and the third color is blue. In at least one embodiment, the plurality of pixels PX includes a plurality of emission areas EA (EA1, EA2, and EA3) corresponding to the color pixels that emit light. In an example, a first color pixel R includes a first emission area EA1, a second color pixel G includes a second emission area EA2, and a third color pixel B includes a third emission area EA3. According to some aspects, the plurality of emission areas EA are areas in which a pixel electrode described with reference to FIG. 12 is exposed by openings of a bank described with reference to FIG. 12, and in which the exposed pixel electrode overlaps an organic light emitting layer described with reference to FIG. 12 in the vertical direction (the Z-axis direction).

According to some aspects, at least one pixel PX includes a non-emission area NEA. In at least one embodiment, the non-emission area NEA at least partially surrounds the emission area EA of a pixel PX. In at least one embodiment, non-emission areas NEA are disposed between the emission areas EA of the pixels PX.

The pixels PX and the emission areas EA of the pixels PX are arranged in various ways according to various embodiments. In at least one embodiment, the first color pixels R and the third color pixels B are spaced apart from each other in the first horizontal direction (the X-axis direction) and the second horizontal direction (the Y-axis direction). In an example, first color pixels R are alternately disposed with third color pixels B in rows in the first horizontal direction (the X-axis direction), and first color pixels R are alternately disposed with third color pixels B in columns in the second horizontal direction (the Y-axis direction). In at least one embodiment, the second color pixels G are repeatedly arranged in the first direction (the X-axis direction) and the second direction (Y-axis direction). In an example, the second color pixels G are arranged in rows in the first horizontal direction (the X-axis direction) and in the second horizontal direction (the Y-axis direction).

In an example, the rows including the second color pixels alternate in the second horizontal direction (the Y-axis direction) with the rows including the first color pixels R and the third color pixels B, and the columns including the second color pixels alternate in the first horizontal direction (the X-axis direction) with the columns including the first color pixels R and the third color pixels B. In an example, a number of first color pixels R and third color pixels B included in an $n^{th}$ row is twice a number of second color pixels G included in an $(n+1)^{th}$ row.

According to some aspects, the plurality of emission areas EA are alternately disposed in diagonal directions DD1 and DD2 between the first horizontal direction (the X-axis direction) and the second horizontal direction (Y-axis direction). In an example, the first diagonal direction DD1 is a direction inclined at an angle of 45° with respect to the first horizontal direction and the second horizontal directions, and the second diagonal direction DD2 is a direction orthogonal to the first diagonal direction DD1. In an example, the first color pixels R and the second color pixels G are alternately arranged in the first diagonal direction DD1 and the second diagonal direction DD2. In an example, third color pixels B and the second color pixels G are alternately arranged in the first diagonal direction DD1 and the second diagonal direction DD2.

According to some aspects, the emission areas EA of the respective color pixels R, G, and B and the non-emission areas NEA disposed in or contacting the respective color pixels R, G, and B have different sizes from each other. In at least one embodiment, the third emission area EA3 has a largest size and the second emission area EA2 has a smallest size (e.g., the third emission area EA3 is larger than the second emission area EA2 and the first emission area EA1, and the second emission area EA2 is smaller than the third emission area EA3 and the first emission area EA1). In at least one embodiment, the size of the second emission area EA2 is the smallest of the emission areas EA, and the size of non-emission areas NEA of the second color pixels G are the largest of the non-emission areas NEA of the color pixels R, G, and B. Therefore, referring to FIG. 12, a width of a bank constituting a non-emission area NEA of a second color pixel G is a largest bank width.

FIG. 7 illustrates an example in which the first emission areas EA1, the second emission areas EA2, and the third emission areas EA3 each have a rhombic shape. According to some aspects, each of the emission areas EA may have a polygonal shape other than a quadrangle, a circular shape, or an elliptical shape.

A pixel unit PXU refers to a group of color pixels capable of expressing gradation. According to some aspects, a pixel unit PXU includes one first color pixel R, two second color pixels G, and one third color pixel B. Each of the first color pixel R, the second color pixels G, and the third color pixel B includes first to seventh transistors T1 to T7, a storage capacitor Cst and a boost capacitor Cboost in a thin film transistor layer, and an emission area EA in a light emitting element layer EML.

According to some aspects, a second touch conductive layer 220 includes the touch electrodes SE forming a mesh structure, a plurality of light-emission openings OP exposing the emission areas EA and through which light emitted by the emission areas EA passes, and a plurality of light-transmission openings PH through which light reflected by the user's fingerprint is incident. FIG. 7 illustrates an example in which the touch electrodes SE and the light-transmission openings PH are disposed in the second touch conductive layer 220 of the touch sensing layer TSL. In at least one embodiment, the first touch conductive layer 210 includes the first connector CP1, the second connector CP2, and the light-transmission openings PH.

According to some aspects, the touch electrodes SE are disposed along the boundaries of the pixel PX in the non-emission areas NEA. In some embodiments, the touch electrodes SE do not overlap the emission areas EA. The touch electrode SE may surround the emission areas EA. In some embodiments, the width of the touch electrode SE is smaller than the width of the non-emission area NEA in one direction. In at least one embodiment, the width of the touch electrode SE is about 5 μm.

According to some aspects, the light-emission openings OP are openings that expose the emission areas EA so that light generated in and/or emitted from the emission areas EA is provided through the light-emission openings OP. In some embodiments, the light-emission openings OP overlap the emission areas EA and overlap at least a portion of the non-emission areas NEA. The light-emission openings OP is an area which is not covered the touch electrode SE. In some embodiments, the light-emission openings OP detect a decrease in luminance of light when the light emitted from the emission areas EA is blocked by the touch electrodes SE.

According to some aspects, the light-emission openings OP have a substantially rhombic shape. According to some aspects, the light-emission openings OP are variously shaped. In some embodiments, a light-emission opening OP has an area equivalent to or larger than an emission area EA, such that the width of the light-emission opening OP in one direction is in a range from about 30 μm to about 40 μm. In some embodiments, the width of the light-emission openings OP are uniform with respect to the plurality of emission areas EA. In an example, a size of the first emission area EA1 is larger than a size of the second emission area EA2, and a size of the light-emission opening OP exposing the first emission area EA1 is the same as a size of the light-emission opening OP exposing the second emission area EA2.

According to some aspects, the plurality of light-transmission openings PH are formed between adjacent pixels PX and the touch electrodes SE. In some embodiments, a light transmitting portion PH is formed between the first color pixel R, the second color pixel G, and the touch electrode SE. In some embodiments, a light transmitting portion PH is formed between the second color pixel G, the third color pixel B, and the touch electrode SE. According to some aspects, the plurality of light-transmission openings PH may have transparent materials to expose a plurality of optical sensors described with reference to FIG. 1. In some embodiments, the plurality of optical sensors PS are disposed in the non-emission area NEA. In some embodiments, the plurality of light-transmission openings PH are formed so that the plurality of optical sensors PS and the touch electrodes SE do not overlap in the second touch conductive layer 220.

According to some aspects, the plurality of light-transmission openings PH do not overlap the emission areas EA. In at least one embodiment, the plurality of light-transmission openings PH are disposed in the non-emission area NEA between the first emission area EA1 and the second emission area EA2. In at least one embodiment, the plurality of light-transmission openings PH are disposed between a proximate pair of second emission areas EA2, and a proximate pair of emission areas including a second emission area EA2 and a third emission area EA3.

According to some aspects, touch electrodes SE are omitted from regions overlapping the optical sensors PS in the third direction (the Z-axis direction). The plurality of light-transmission openings PH may instead be formed in the regions overlapping the optical sensors PS in the third direction, thereby discouraging light reflected by the user's fingerprint from being blocked by the touch electrodes SE.

In some embodiments, the plurality of light-transmission openings PH overlap first sensing channels of light-sensing transistors of the optical sensors PS described with reference to FIG. 11 in the third direction (Z-axis direction). As the plurality of light-transmission openings PH are disposed in regions overlapping the first sensing channels of the plurality of optical sensors PS in the third direction (the Z-axis direction), the light reflected from the user's fingerprint passes through the light-transmission openings PH without being blocked by the touch electrodes SE.

Accordingly, in some embodiments, light reflected by the touch electrode SE is incident to the first sensing channels without being blocked or interfered with. As valleys and ridges of a user's fingerprint are distinguished through the reflected light incident to the first sensing channels without interference with the touch electrodes SE, an accuracy of a recognition of the user's fingerprint is increased.

According to some aspects, the size of a second emission area EA2 is smaller than that of a first emission area EA1 or that of a third emission area EA3, and the plurality of light-transmission openings PH are disposed closest to the second color pixels G including the second emission areas EA2. In this case, the area of the non-emission area NEA included in the second color pixel G is larger than the area of the non-emission area NEA included in the first color pixel R or the third color pixel B, and, for the same reason, a width of a bank overlapping the second color pixel G is larger than a width of a bank overlapping the first color pixel R or the third color pixel B. Accordingly, in this case, the light-transmission openings PH that are disposed closest to the second color pixel G of the plurality of light-transmission openings PH have a maximum width of the light-transmission openings PH.

According to some aspects, the number of the light-transmission openings PH is less than the number of the light-emission openings OP. According to some aspects, the number of the light-emission openings OP is equivalent to the number of the emission areas EA, and the number of the light-transmission openings PH is less than the number of the emission areas EA. According to some aspects, an appropriate number of light-transmission openings PH are included to provide an appropriate spacing between the light-transmission openings PH, such that light reflected by the user's fingerprint is not scattered and does not act as noise when the light is incident. In some embodiments, a maximum size (e.g., a width in one direction or an area) of at least one light-transmission opening PH is about 5 μm (e.g., the width of the touch electrode SE in one direction). In some embodiments, the maximum size of the light-transmission opening PH is smaller than the size (e.g., a width in one direction or an area) of the light-emission opening OP. According to some aspects, at least one light-transmission opening PH has a polygonal, circular, or elliptical shape.

Figure 8:
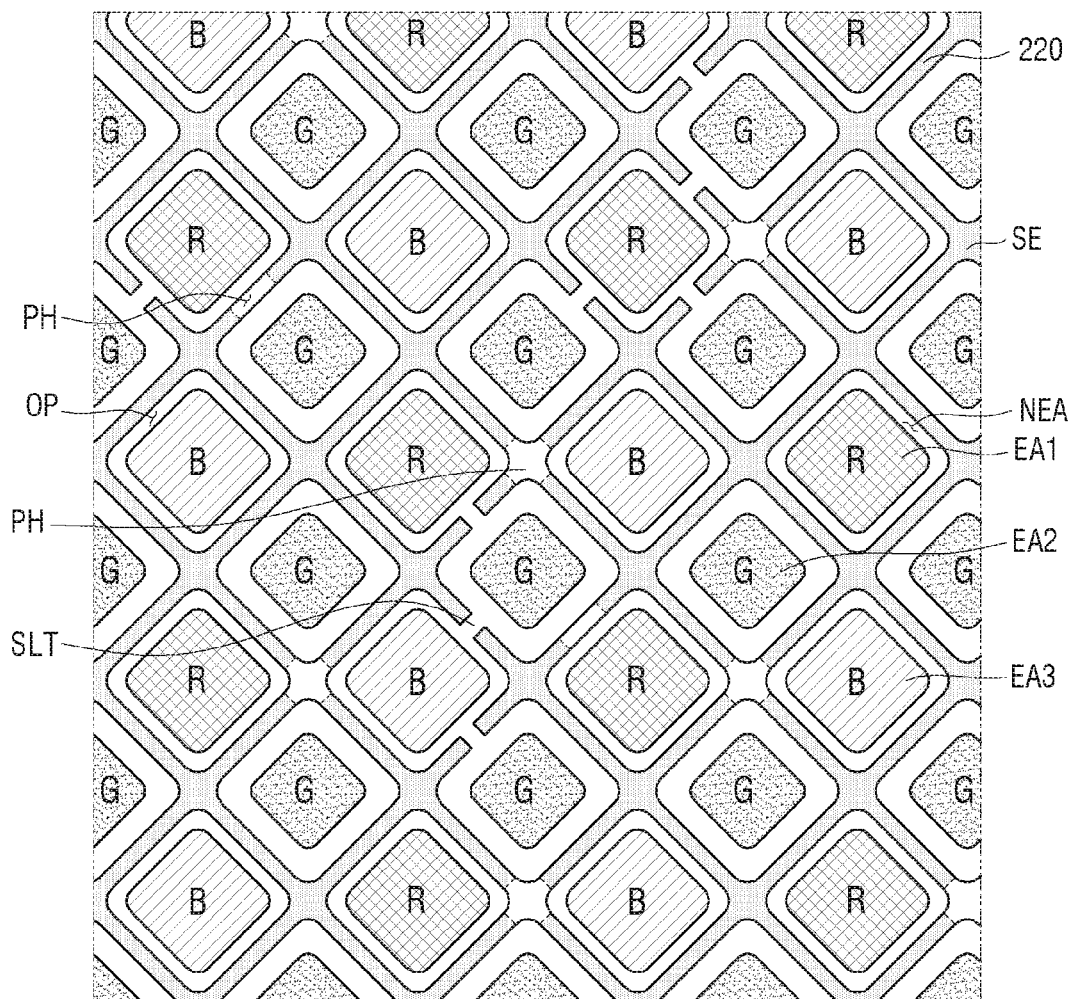
FIG. 8 is a plan layout view of a mesh structure of pixels and touch electrodes according to at least one embodiment.

FIG. 8 is a plan layout view of a mesh structure of pixels and touch electrodes according to at least one embodiment.

Referring to FIG. 8, according to some aspects, the second touch conductive layer 220 includes slits SLT exposing gaps between proximate pairs of pixels PX. In some embodiments, at least one slit SLT overlaps the non-emission area NEA and the bank BK, and is positioned between adjacent emission areas EA. In some embodiments, a width of at least one slit SLT in one direction is smaller than a width of a light transmitting portion PH in one direction. In some embodiments, the slits SLT are disposed between pixels PX, thereby reducing a decrease in visibility due to external light, and are disposed regardless of positions of the optical sensors PS. In an example, the slits SLT do not overlap the optical sensors PS. In some embodiments, at least one slit SLT does not overlap the light-sensing transistor LT1.

Figure 9:
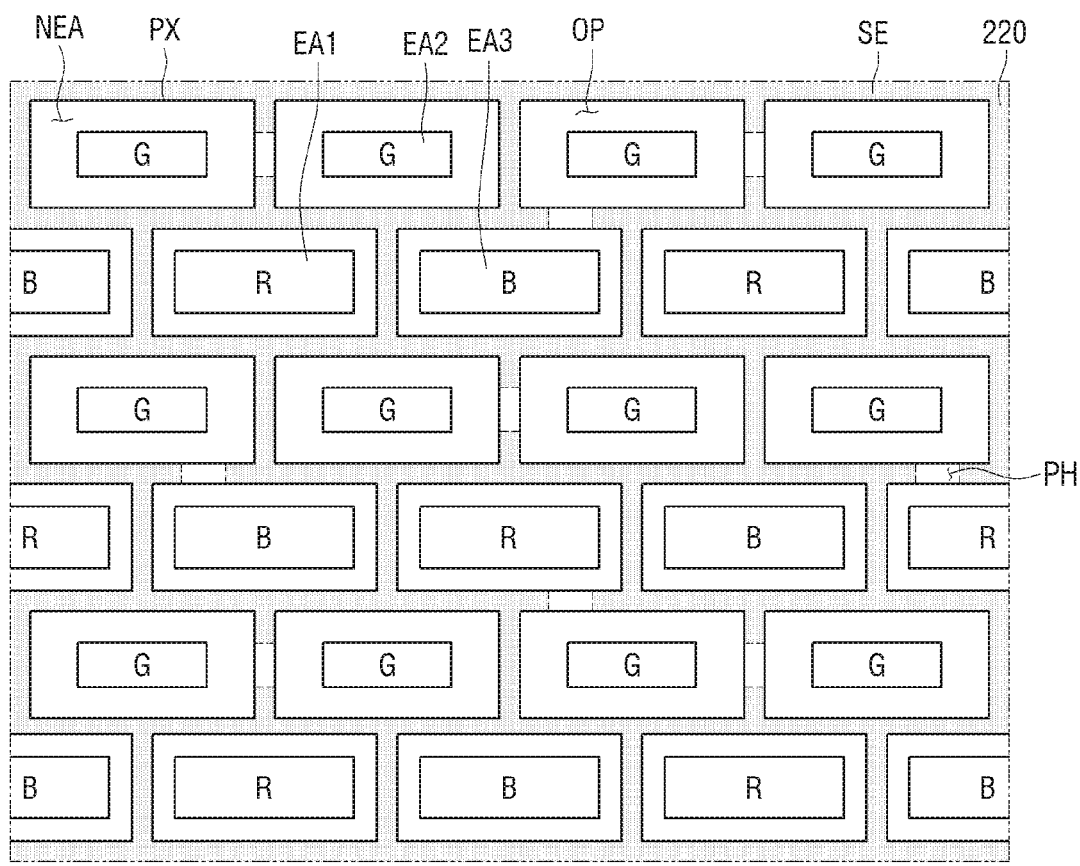
FIG. 9 is a plan layout view of a mesh structure of pixels and touch electrodes according to at least one embodiment.
Figure 9:
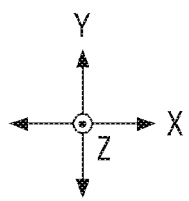

FIG. 9 is a plan layout view of a mesh structure of pixels and touch electrodes according to at least one embodiment.

Referring to FIG. 9, according to some aspects, each of the pixels PX has a rectangular shape. In some embodiments, the pixels PX described with reference to FIG. 9 include second color pixels G repeatedly arranged in the first direction (the X-axis direction) and the second direction (the Y-axis direction), and include the first color pixels R and the third color pixels B alternately arranged in the first direction (the X-axis direction) and the second direction (the Y-axis direction).

Figure 10:
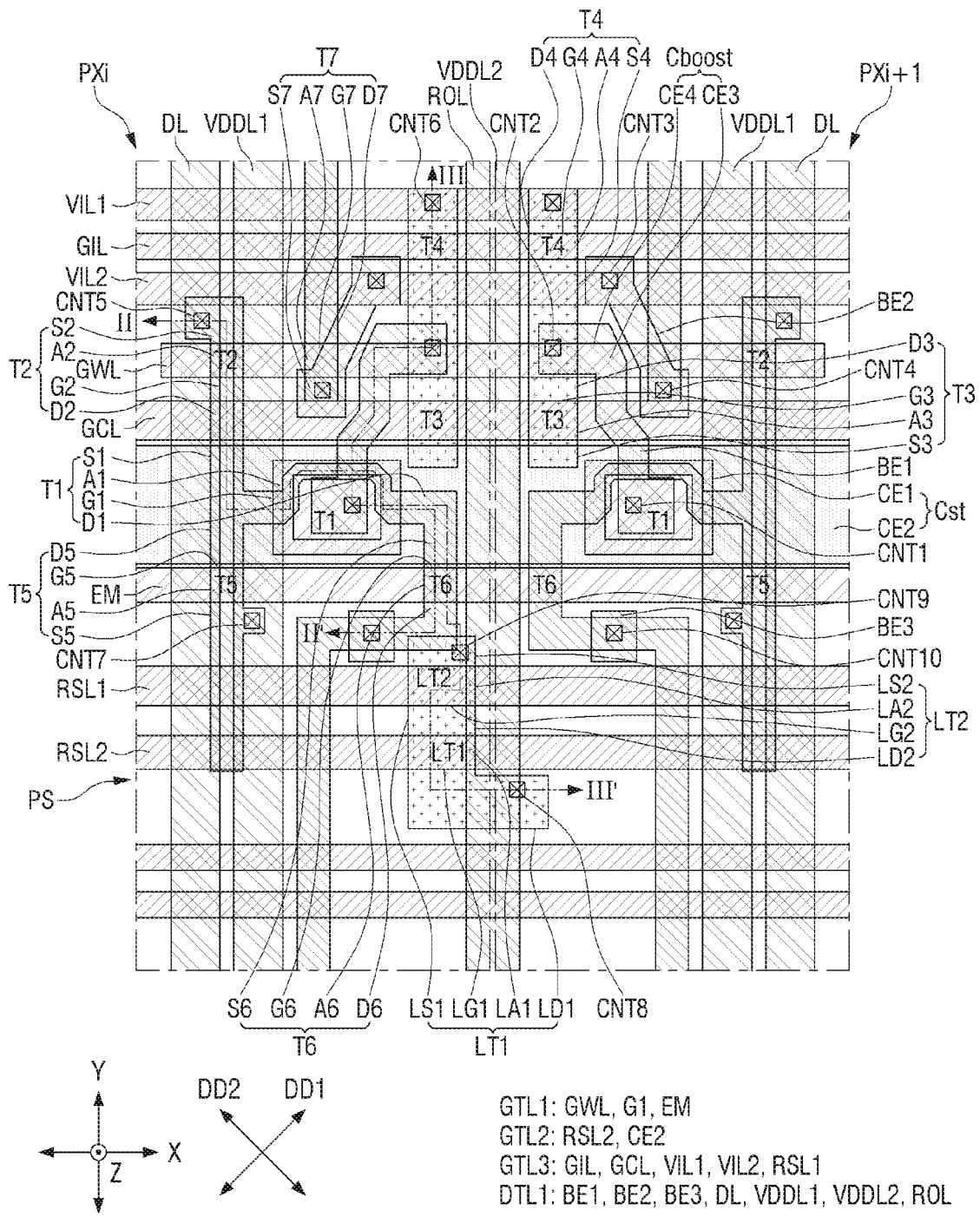
FIG. 10 is an enlarged layout view of portion A of FIG. 7 showing a thin film transistor layer of pixels and optical sensors.

FIG. 10 is an enlarged layout view of portion A of FIG. 7 showing a thin film transistor layer of pixels and optical sensors. FIG. 11 is an enlarged layout view of portion A of FIG. 7 showing the thin film transistor layer and a mesh conductive layer of the pixels and the optical sensors. FIGS. 10 and 11 schematically illustrate positions of a plurality of thin film transistors and capacitors disposed in two adjacent pixels PXi and PXi+1. FIG. 10 is a diagram illustrating a first semiconductor layer ACT1, a first gate layer GTL1, a second gate layer GTL2, a second semiconductor layer ACT2, a third gate layer GTL3, and a first data conductive layer DTL1 stacked in order. FIG. 11 is a diagram illustrating the touch electrode SE, the light-emission openings OP, and the light-transmission openings PH of the second touch conductive layer 220 in addition to the first semiconductor layer ACT1, the first gate layer GTL1, the second gate layer GTL2, the second semiconductor layer ACT2, the third gate layer GTL3, and the first data conductive layer DTL1 stacked in order described with reference to FIG. 10.

According to some aspects, the first semiconductor layer ACT1 includes a first channel A1, a first electrode S1, and a second electrode D1 of the first transistor T1. According to some aspects, the first semiconductor layer ACT1 likewise includes first channels A2, A5, A6, and A7, first electrodes S2, S5, S6, and S7, and second electrodes D2, D5, D6, and D7 of the second transistor T2, the fifth transistor T5, the sixth transistor T6, and the seventh transistor T7, respectively. According to some aspects, the first semiconductor layer ACT1 includes low-temperature polycrystalline silicon (LTPS).

According to some aspects, the first gate layer GTL1 includes the scan write line GWL, a gate electrode G1 of the first transistor T1, and the emission line EM. In some embodiments, the scan write line GWL and the emission line EM extend in the first horizontal direction (the X-axis direction). In some embodiments, the gate electrode G1 of the first transistor T1 is disposed between the scan write line GWL and the emission line EM.

According to some aspects, the second gate layer GTL2 includes the second sensing scan line RSL2 and a second capacitor electrode CE2. In some embodiments, the second sensing scan line RSL2 extends in the first horizontal direction (the X-axis direction).

According to some aspects, the second semiconductor layer ACT2 includes channels A3 and A4, first electrodes D3 and D4, and second electrodes S3 and S4 of the third transistor T3 and the fourth transistor T4, respectively. In some embodiments, the second semiconductor layer ACT2 includes channels LA1 and LA2, first electrodes LD1 and LD2, and second electrodes LS1 and LS2 of the light-sensing transistor LT1 and the sensing switch transistor LT2, respectively. According to some aspects, the second semiconductor layer ACT2 includes an oxide semiconductor.

According to some aspects, the third gate layer GTL3 includes the scan initialization line GIL, the scan control line GCL, the first initialization voltage line VIL1, the second initialization voltage line VIL2, and the first sensing scan line RSL1. IN some embodiments, the scan initialization line GIL, the scan control line GCL, the first initialization voltage line VIL1, the second initialization voltage line VIL2, and the first sensing scan line RSL1 extend in the first horizontal direction (the X-axis direction).

According to some aspects, the first data conductive layer DTL1 includes a first connection electrode BE1, a second connection electrode BE2, a third connection electrode BE3, the data line DL, the first driving voltage line VDDL1, the second driving voltage line VDDL2, and the read-out line ROL. In some embodiments, the data line DL, the first driving voltage line VDDL1, the second driving voltage line VDDL2, and the read-out line ROL extend in the second horizontal direction (the Y-axis direction).

Figure 11:
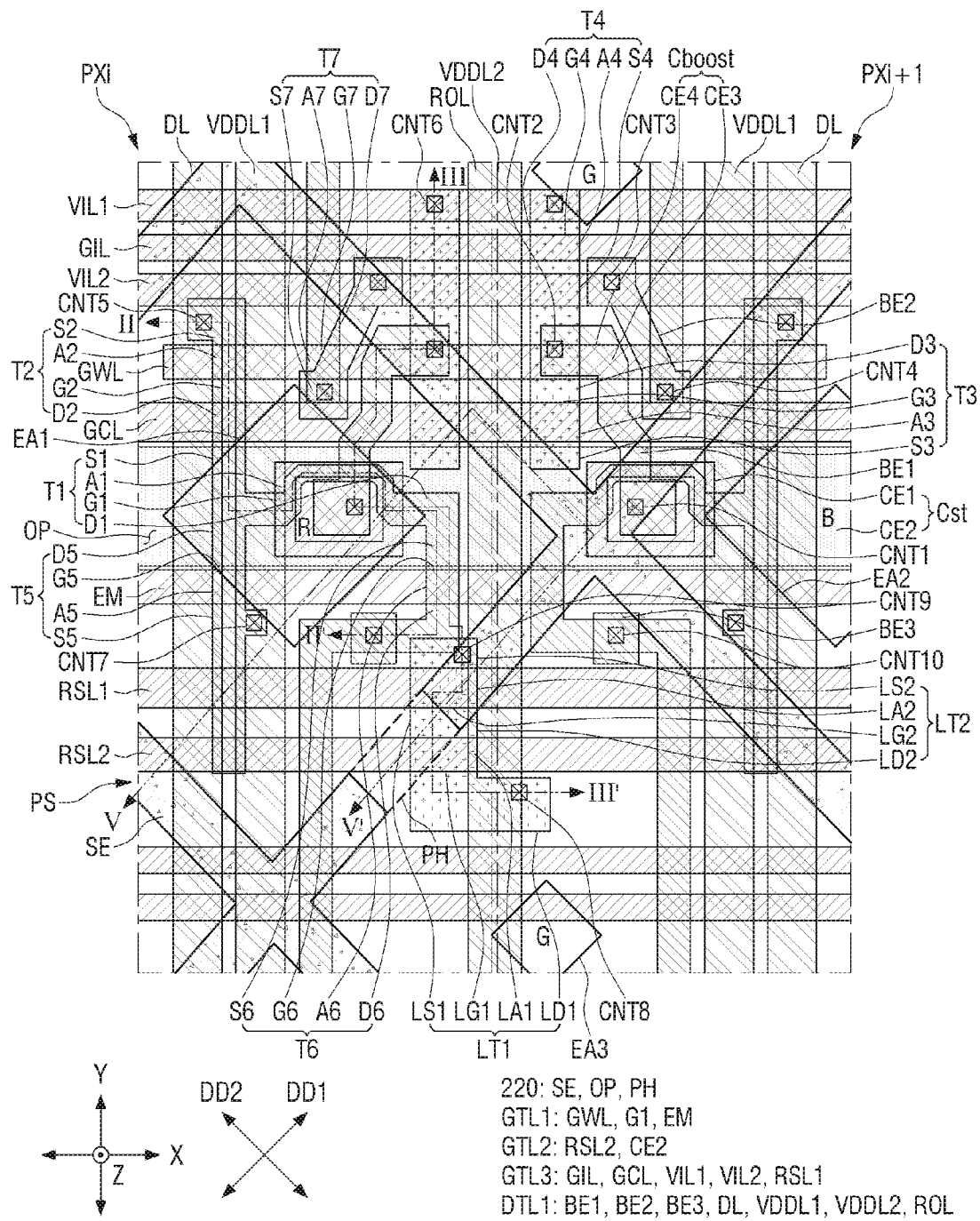
FIG. 11 is an enlarged layout view of portion A of FIG. 7 showing the thin film transistor layer and a mesh conductive layer of the pixels and the optical sensors.

In FIGS. 10 and 11, in some embodiments, the read-out line ROL is disposed in the $i^{th}$ pixel PXi, where i is a positive integer, and is omitted from the $(i+1)^{th}$ pixel PXi+1. In some embodiments, the second driving voltage line VDDL2 is disposed in the $(i+1)^{th}$ pixel PXi+1 and is omitted from the $i^{th}$ pixel PXi.

According to some aspects, the first transistor T1 includes the first channel A1, the gate electrode G1, the first electrode S1, and the second electrode D1. In some embodiments, the first channel A1 of the first transistor T1 is disposed in the first semiconductor layer ACT1 and overlaps the gate electrode G1 of the first transistor T1. According to some aspects, the first semiconductor layer ACT1 includes low-temperature polycrystalline silicon (LTPS).

According to some aspects, the gate electrode G1 of the first transistor T1 overlaps the first connection electrode BE1 In some embodiments, the gate electrode G1 of the first transistor T1 is connected to the first connection electrode BE1 through the first contact hole CNT1, and the first connection electrode BE1 is connected to the second electrode S3 of the third transistor T3 through a second contact hole CNT2. In some embodiments, a region of the gate electrode G1 of the first transistor T1 that overlaps the second capacitor electrode CE2 corresponds to a first capacitor electrode CE1 of the storage capacitor Cst.

According to some aspects, the first electrode S1 of the first transistor T1 is connected to the second electrode D5 of the fifth transistor T5 and the second electrode D2 of the second transistor T2. According to some aspects, the second electrode D1 of the first transistor T1 is connected to the first electrode S6 of the sixth transistor T6.

In some embodiments, the second transistor T2 includes the second channel A2, the gate electrode G2, the first electrode S2, and the second electrode D2. In some embodiments, the second channel A2 of the second transistor T2 is disposed in the first semiconductor layer ACT1. In some embodiments, the gate electrode G2 of the second transistor T2 is a portion of the scan write line GWL, and is an overlapping region between the second channel A2 of the second transistor T2 and the scan write line GWL.

According to some aspects, the first electrode S2 of the second transistor T2 is connected to the data line DL through a fifth contact hole CNT5. In some embodiments, the second electrode D2 of the second transistor T2 is connected to the first electrode S1 of the first transistor T1 and the second electrode D5 of the fifth transistor T5.

According to some aspects, the third transistor T3 includes the third channel A3, the gate electrode G3, the first electrode D3, and the second electrode S3. in some embodiments, the third channel A3 of the third transistor T3 is disposed in the second semiconductor layer ACT2. In some embodiments, the third channel A3 of the third transistor T3 is a portion of the scan control line GCL, and is an overlapping region between the third channel A3 of the third transistor T3 and the scan control line GCL.

According to some aspects, the first electrode D3 of the third transistor T3 is connected to the second electrode S4 of the fourth transistor T4, and is connected to the first connection electrode BE1 through the second contact hole CNT2. In some embodiments, the second electrode S3 of the third transistor T3 is connected to the second electrode D2 of the first transistor T1 through a contact hole.

According to some aspects, the fourth transistor T4 includes the fourth channel A4, the gate electrode G4, the first electrode D4, and the second electrode S4. In some embodiments, the fourth channel A4 of the fourth transistor T4 is disposed in the second semiconductor layer ACT2. In some embodiments, the fourth channel A4 of the fourth transistor T4 is a portion of the scan initialization line GIL, and is an overlapping region between the fourth channel A4 of the fourth transistor T4 and the scan initialization line GIL.

According to some aspects, the first electrode D4 of the fourth transistor T4 is connected to the first initialization voltage line VIL1 through a sixth contact hole CNT6. In some embodiments, the second electrode S4 of the fourth transistor T4 is connected to the first electrode D3 of the third transistor T3, and is connected to the first connection electrode BE1 through the second contact hole CNT2.

According to some aspects, the fifth transistor T5 includes the fifth channel A5, the gate electrode G5, the first electrode S5, and the second electrode D5. In some embodiments, the fifth channel A5 of the fifth transistor T5 is disposed in the first semiconductor layer ACT1. In some embodiments, the gate electrode G5 of the fifth transistor T5 is a portion of the emission line EM, and is an overlapping region between the fifth channel A5 of the fifth transistor T5 and the emission line EM.

According to some aspects, the first electrode S5 of the fifth transistor T5 is connected to the first driving voltage line VDDL1 through a seventh contact hole CNT7. In some embodiments, the second electrode D5 of the fifth transistor T5 is connected to the first electrode S1 of the first transistor T1 and the second electrode D2 of the second transistor T2.

According to some aspects, the sixth transistor T6 includes the sixth channel A6, the gate electrode G6, the first electrode S6, and the second electrode D6. In some embodiments, the sixth channel A6 of the sixth transistor T6 is disposed in the first semiconductor layer ACT1. In some embodiments, the gate electrode G6 of the sixth transistor T6 is a portion of the emission line EM, and is an overlapping region between the sixth channel A6 of the sixth transistor T6 and the emission line EM.

According to some aspects, the first electrode S6 of the sixth transistor T6 is connected to the second electrode D1 of the first transistor T1. In some embodiments, the second electrode D6 of the sixth transistor T6 is connected to the third connection electrode BE3 through a tenth contact hole CNT10. In some embodiments, an anode connection electrode ANDE is connected to the third connection electrode BE3 through a first anode contact hole described with reference to FIG. 12.

According to some aspects, the seventh transistor T7 includes the seventh channel A7, the gate electrode G7, the first electrode S7, and the second electrode D7. In some embodiments, the seventh channel A7 of the seventh transistor T7 is disposed in the first semiconductor layer ACT1. In some embodiments, the gate electrode G7 of the seventh transistor T7 is a portion of the scan write line GWL, and is an overlapping region between the seventh channel A7 of the seventh transistor T7 and the scan write line GWL.

According to some aspects, the first electrode S7 of the seventh transistor T7 is connected to the second connection electrode BE2 through a fourth contact hole CNT4, and the second connection electrode BE2 is connected to the second initialization voltage line VIL2 through a third contact hole CNT3. In some embodiments, the first electrode S7 of the seventh transistor T7 is connected to the second initialization voltage line VIL2 via the second connection electrode BE2. In some embodiments, the second electrode D7 of the seventh transistor T7 is connected to the second electrode D6 of the sixth transistor T6 disposed in a previous sub-pixel (e.g., an adjacent sub-pixel).

According to some aspects, the storage capacitor Cst includes the first capacitor electrode CE1 and the second capacitor electrode CE2. In some embodiments, the first capacitor electrode CE1 is a portion of the gate electrode G1 of the first transistor T1, and is overlapped by a region of the gate electrode G1 of the first transistor T1. In some embodiments, the second capacitor electrode CE2 is connected to the first driving voltage line VDDL1 through a contact hole.

According to some aspects, the boost capacitor Cboost includes a third capacitor electrode CE3 and a fourth capacitor electrode CE4. In some embodiments, the third capacitor electrode CE3 is a portion of the scan write line GWL, and the fourth capacitor electrode CE4 is a portion of the first connection electrode BEl. In some embodiments, the boost capacitor Cboost is formed in a region where the scan write line GWL and the first connection electrode BE1 overlap.

According to some aspects, the light-sensing transistor LT1 includes the first sensing channel LA1, a gate electrode LG1, the first electrode LD1, and the second electrode LS1. In some embodiments, the first sensing channel LA1 of the light-sensing transistor LT1 is disposed in the second semiconductor layer ACT2. In some embodiments, the gate electrode LG1 of the light-sensing transistor LT1 is a portion of the second sensing scan line RSL2, and is an overlapping region between the first sensing channel LA1 of the light-sensing transistor LT1 and the second sensing scan line RSL2.

According to some aspects, the first electrode LD1 of the light-sensing transistor LT1 is connected to the second driving voltage line VDDL2 through an eighth contact hole CNT8. In some embodiments, the second electrode LS1 of the light-sensing transistor LT1 is connected to the first electrode LD2 of the sensing switch transistor LT2.

According to some aspects, the sensing switch transistor LT2 includes the second sensing channel LA2, a gate electrode LG2, the first electrode LD2, and the second electrode LS2. In some embodiments, the second sensing channel LA2 of the sensing switch transistor LT2 is disposed in the second semiconductor layer ACT2. In some embodiments, the gate electrode LG2 of the sensing switch transistor LT2 is a portion of the first sensing scan line RSL1, and is an overlapping region between the second sensing channel LA2 of the sensing switch transistor LT2 and the first sensing scan line RSL1.

According to some aspects, the first electrode LD2 of the sensing switch transistor LT2 is connected to the first electrode LD2 of the light-sensing transistor LT1. In some embodiments, the second electrode LS2 of the sensing switch transistor LT2 is connected to the read-out line ROL through a ninth contact hole CNT9.

According to some aspects, a plurality of sensing transistors (for example, LT1 and LT2) included in the optical sensor PS are disposed between the $i^{th}$ pixel PXi and the $(i+1)^{th}$ pixel PXi+1 that are adjacent to each other. In some embodiments, the plurality of sensing transistors sense light in response to being connected to the read-out line ROL disposed in the $i^{th}$ pixel PXi and the second driving voltage line VDDL2 disposed in the $(i+1)^{th}$ pixel PXi+1. In some embodiments, as a number of wires disposed in each pixel PX decreases, an area for the disposition of the pixel PX is provided. Referring to FIG. 10, in some embodiments, the second driving voltage line VDDL2 and the read-out line ROL connected to the optical sensor PS are respectively disposed in two adjacent pixels PXi and PXi+1, and the area for the disposition of one pixel PX is provided. In some embodiments, one optical sensor PS is disposed for one pixel PX.

Referring to FIG. 11, according to some aspects, the second touch conductive layer 220 includes the touch electrode SE having the mesh structure, the light-emission openings OP, and the light-transmission openings PH. In some embodiments, the plurality of emission areas EA1, EA2, and EA3 are disposed in the light-emission openings OP for the pixels R, G, and B, respectively. In at least one embodiment, the $i^{th}$ pixel PXi is the first color pixel R, and the $(i+1)^{th}$ pixel PXi+1 is the third color pixel B.

According to some aspects, the touch electrodes SE are disposed in the first diagonal direction DD1 and the second diagonal direction DD2, and do not overlap the emission areas EA1, EA2, and EA3. In some embodiments, the light-emission openings OP expose the first emission area EA1, the second emission area EA2, and the third emission area EA3, respectively.

According to some aspects, at least one light-transmission opening PH is formed at a position from which a touch electrode SE disposed in an area overlapping the first sensing channel LA1 of the light-sensing transistor LT1 is removed. In some embodiments, at least one light-transmission opening PH is disposed between the first color pixel R and the second color pixel G. In some embodiments, at least one light-transmission opening PH is formed at any position in which the first sensing channel LA1 is exposed by the light-transmission opening PH.

Figure 13:
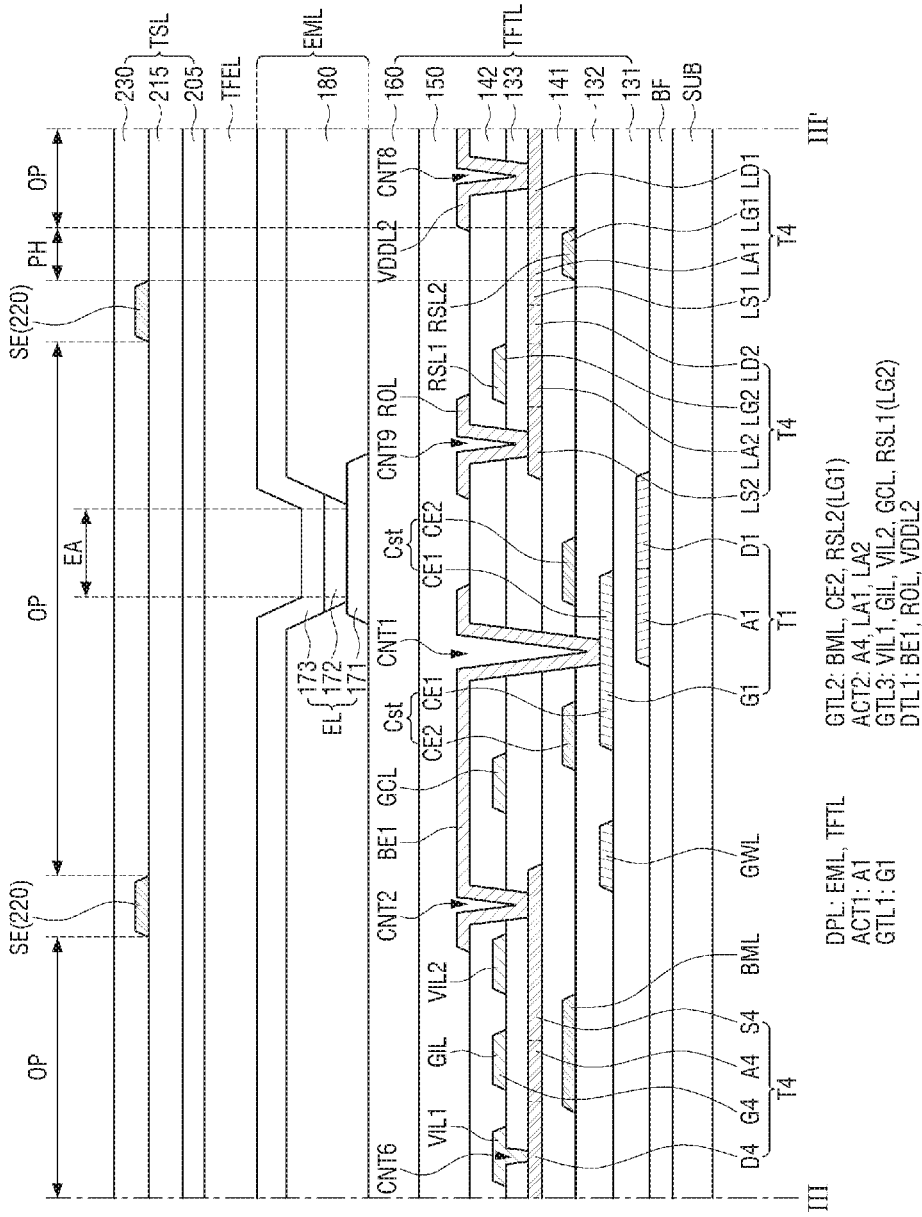
FIG. 13 is a cross-sectional view taken along line III-III' of FIGS. 10 and 11.
Figure 14:
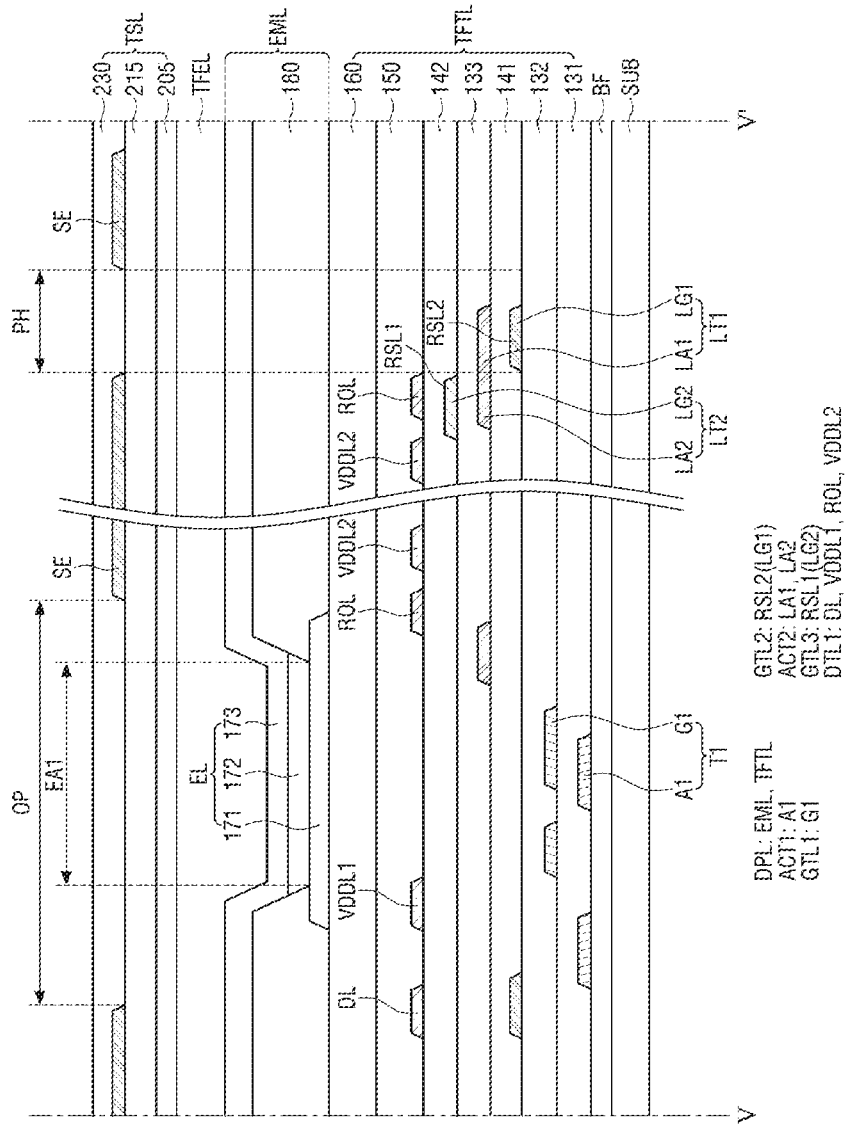
FIG. 14 is a cross-sectional view taken along line V-V' of FIGS. 10 and 11.

FIG. 12 is a cross-sectional view taken along line II-IT of FIGS. 10 and 11. FIG. 13 is a cross-sectional view taken along line III-III' of FIGS. 10 and 11. FIG. 14 is a cross-sectional view taken along line V-V' of FIGS. 10 and 11.

Referring to FIGS. 12 to 14, according to some aspects, the display device 1 includes the substrate SUB, a buffer layer BF, the display layer DPL including the thin film transistor layer TFTL and the light emitting element layer EML, the encapsulation layer TFEL, and the touch sensing layer TSL. In some embodiments, the thin film transistor layer TFTL includes the first semiconductor layer ACT1, a first gate insulating layer 131, the first gate layer GTL1, a second gate insulating layer 132, the second gate layer GTL2, a first interlayer insulating layer 141, the second semiconductor layer ACT2, a third gate insulating layer 133, the third gate layer GTL3, a second interlayer insulating layer 142, the first data conductive layer DTL1, a first planarization layer 150, a second data conductive layer, and a second planarization layer 160.

According to some aspects, the substrate SUB is a base substrate and includes an insulating material such as polymer resin. In some embodiments, the substrate SUB is a flexible substrate that bends, folds, and/or rolls.

According to some aspects, the buffer layer BF is disposed on one surface of the substrate SUB. In some embodiments, the buffer layer BF is formed on one surface of the substrate SUB to protect the thin film transistors and the organic light emitting layer 172 of the light emitting element layer EML from moisture permeating through the substrate SUB.

According to some aspects, the first semiconductor layer ACT1 is disposed on the substrate SUB or the buffer layer BF. In some embodiments, the first semiconductor layer ACT1 includes a silicon-based material. In some embodiments, the first semiconductor layer ACT1 includes low-temperature polycrystalline silicon LTPS. According to some aspects, the first semiconductor layer ACT1 includes a first channel A1, a first electrode S1, and a second electrode D1 of the first transistor T1, and includes first channels A2, A5, A6 and A7, first electrodes S2, S5, S6 and S7, and second electrodes D2, D5, D6 and D7 of the second transistor T2, the fifth transistor T5, the sixth transistor T6, and the seventh transistor T7, respectively. In some embodiments, a light-blocking layer for blocking external light incident to the first semiconductor layer ACT1 is formed under the first semiconductor layer ACT1.

According to some aspects, the first gate insulating layer 131 covers the buffer layer BF and the first semiconductor layer ACT1, and insulates the first semiconductor layer ACT1 from the first gate layer GTL1. In some embodiments, the first gate insulating layer 131 is formed of an inorganic layer such as a silicon nitride layer, a silicon oxynitride layer, a silicon oxide layer, a titanium oxide layer, or an aluminum oxide layer.

According to some aspects, the first gate layer GTL1 is disposed on the first gate insulating layer 131. In some embodiments, the first gate layer GTL1 includes the scan write line GWL, the emission lines EM, and the gate electrodes G1, G2, G5, G6, and G7 of the first transistor T1, the second transistor T2, the fifth transistor T5, the sixth transistor T6, and the seventh transistor T7, respectively. In some embodiments, the first gate layer GTL1 is formed as a single layer or as multiple layers including any one of molybdenum (Mo), aluminum (Al), chromium (Cr), gold (Au), titanium (Ti), nickel (Ni), neodymium (Nd), copper (Cu), or an alloy thereof.

According to some aspects, the second gate insulating layer 132 covers the first gate layer GTL1 and the first gate insulating layer 131. In some embodiments, the second gate insulating layer 132 insulates the first gate layer GTL1 from the second gate layer GTL2. In some embodiments, the second gate insulating layer 132 includes a same material as included in the first gate insulating layer 131.

According to some aspects, the second gate layer GTL2 is disposed on the second gate insulating layer 132. In some embodiments, the second gate layer GTL2 includes the second sensing scan line RSL2, the second capacitor electrode CE2, and the gate electrode LG1 of the light-sensing transistor LT1. In some embodiments, the second gate layer GTL2 includes a light-blocking layer BML. According to some aspects, the light-blocking layer BML suppresses light incident from below a display panel described with reference to FIG. 1 from reaching the second semiconductor layer ACT2. In some embodiments, the second gate layer GTL2 includes a same material included in the first gate layer GTL1.

According to some aspects, the first interlayer insulating layer 141 covers the second gate layer GTL2 and the second gate insulating layer 132. In some embodiments, the first interlayer insulating layer 141 insulates the second gate layer GTL2 and the second semiconductor layer ACT2. In some embodiments, the first interlayer insulating layer 141 is formed of an inorganic layer such as a silicon nitride layer, a silicon oxynitride layer, a silicon oxide layer, a titanium oxide layer, or an aluminum oxide layer.

According to some aspects, the second semiconductor layer ACT2 is disposed on the first interlayer insulating layer 141. In some embodiments, the second semiconductor layer ACT2 includes an oxide-based material. In some embodiments, the channels A3 and A4, the first electrodes D3 and D4, and the second electrodes S3 and S4 of the third transistor T3 and the fourth transistor T4, respectively, are disposed in the second semiconductor layer ACT2. In some embodiments, the channels LA1 and LA2, the first electrodes LD1 and LD2, and the second electrodes LS1 and LS2 of the light-sensing transistor LT1 and the sensing switch transistor LT2, respectively, are disposed in the second semiconductor layer ACT2.

In at least one embodiment, the first sensing channel LA1 of the light-sensing transistor LT1 senses external light via a light sensitive oxide semiconductor material having high light sensitivity included in the light-sensing transistor LT1. In some embodiments, the light sensitive oxide semiconductor material includes one or more of ZnO, InO, SnO, InZnO, ZnSnO, InSnO, or the like.

In some embodiments, the light sensitive oxide semiconductor varies a threshold voltage according to a wavelength or amount of incident light and is therefore implemented as an optical sensor. For example, when light is applied to a transistor including the light sensitive oxide semiconductor, the threshold voltage moves in a negative direction (e.g., decreases) and a drain current increases.

In some embodiments, a drain current $I_{d2}$ is a drain current when light is applied to the oxide semiconductor transistor, and $I_{d1}$ is a drain current when light is not applied to the oxide semiconductor transistor. The ratio of $I_{d2}$ to $I_{d1}$ is not larger, and so the oxide semiconductor transistor can be used as an optical sensor having a high sensitivity. In some embodiments, the ratio is greatest near the threshold voltage when no light is applied to the oxide semiconductor transistor.

According to some aspects, the first sensing channel LA1 is formed of a single layer including the light sensitive oxide semiconductor material. According to some aspects, the first sensing channel L1 is formed of various stacked structures may be employed. In some embodiments, the light absorptance of the first sensing channel LA1 is higher than the light absorptance of the first semiconductor layer ACT1.

According to some aspects, the second sensing channel LA2 includes the light sensitive oxide semiconductor material. In some embodiments, the second sensing channel LA2 includes a light insensitive oxide semiconductor material that is not sensitive to light. In an example, the light insensitive oxide semiconductor material includes at least one of Hf, Zr, Ti, Ta, Ga, Nb, V, Al, Ga, or Sn, and at least one of ZnO, InO, SnO, InZnO, ZnSnO, or InSnO. In this case, the sensing switch transistor LT2 is implemented as a switch transistor having constant electrical characteristics regardless of the application of light to the sensing switch transistor LT2.

According to some aspects, the third gate insulating layer 133 covers the first interlayer insulating layer 141 and the second semiconductor layer ACT2 and insulates the second semiconductor layer ACT2 from the third gate layer GTL3. In some embodiments, the third gate insulating layer 133 includes a same material included in the first gate insulating layer 131.

According to some aspects, the third gate layer GTL3 is disposed on the third gate insulating layer 133. In some embodiments, the third gate layer GTL3 includes the scan initialization line GIL, the scan control line GCL, the first initialization voltage line VIL1, the second initialization voltage line VIL2, and the first sensing scan line RSL1. In some embodiments, the third gate layer GIL3 includes the gate electrodes G3 and G4 of the third transistor T3 and the fourth transistor T4, respectively. In some embodiments, the third gate layer GIL3 includes the gate electrode LG2 of the sensing switch transistor LT2. In some embodiments, the third gate layer GTL3 includes a same material included in the first gate layer GTL1.

According to some aspects, the first data conductive layer DTL1 is disposed on the second interlayer insulating layer 142. In some embodiments, the first data conductive layer DTL1 includes the first connection electrode BE1, the second connection electrode BE2, the third connection electrode BE3, the data line DL, the first driving voltage line VDDL1, the second driving voltage line VDDL2, and the read-out line ROL. In some embodiments, the data line DL, the first driving voltage line VDDL1, the second driving voltage line VDDL2, and the read-out line ROL extend in the second horizontal direction (the Y-axis direction). In some embodiments, the first data conductive layer DTL1 is formed of a single layer or multiple layers including any one of molybdenum (Mo), aluminum (Al), chromium (Cr), gold (Au), titanium (Ti), nickel (Ni), neodymium (Nd), copper (Cu), or an alloy thereof.

According to some aspects, the first planarization layer 150 covers the first data conductive layer DTL1 and the second interlayer insulating layer 142. In some embodiments, the first planarization layer 150 flattens protrusions caused by the first semiconductor layer ACT1, the first gate layer GTL1, the second gate layer GTL2, the second semiconductor layer ACT2, the third gate layer GTL3, and the first data conductive layer DTL1. In some embodiments, the first planarization layer 150 is formed of an organic layer such as an acryl resin layer, an epoxy resin layer, a phenolic resin layer, a polyamide resin layer, a polyimide resin layer, or the like.

According to some aspects, the second data conductive layer is disposed on the first planarization layer 150. In some embodiments, the second data conductive layer includes an anode connection electrode ANDE. In some embodiments, the second data conductive layer includes a same material included in the first data conductive layer DTL1.

According to some aspects, the second planarization layer 160 covers the second data conductive layer and the first planarization layer 150. In some embodiments, the second planarization layer 160 flattens a protrusion caused by the second data conductive layer. In some embodiments, the second planarization layer 160 includes a same material included in the first planarization layer 150.

According to some aspects, the first to seventh transistors T1 to T7 and the sensing switch transistor LT2 are formed in an upper gate (top gate) structure in which a gate electrode is positioned on a semiconductor layer, as shown in FIGS. 12 to 14. According to some aspects, the first to seventh transistors T1 to T7 and the sensing switch transistor LT2 are formed in a lower gate (bottom gate) structure in which a gate electrode is positioned below an active layer, or in a double gate structure in which gate electrodes are located both above and below the active layer. For example, the light-blocking layer BML disposed in the second gate layer GTL2 may be implemented as bottom gate electrodes of the third transistor T3 and the fourth transistor T4. In this case, the third transistor T3 and the fourth transistor T4 have a double gate structure.

According to some aspects, the light-sensing transistor LT1 is a transistor configured to receive light reflected from a user's fingerprint, and as such, no layer is disposed above the first sensing channel LA1 so that light reception is maximized. In some embodiments, the light-sensing transistor LT1 is formed in a lower gate structure in which a gate electrode is positioned under a semiconductor layer. In some embodiments, the first sensing channel LA1 of the light-sensing transistor LT1 is disposed on the gate electrode LG1, and light reflected from the user's fingerprint therefore directly reaches the first sensing channel LA1. In some embodiments, as the threshold voltage characteristic of the light-sensing transistor LT1 changes according to a wavelength or amount of incident light directly reaching the first sensing channel LA1, the light-sensing transistor LT1 is used as an optical sensor PS with increased light efficiency.

According to some aspects, the first contact hole CNT1 is a hole exposing the gate electrode G1 of the first transistor T1 through the second gate insulating layer 132, the first interlayer insulating layer 141, the third gate insulating layer 133, and the second interlayer insulating layer 142. In some embodiments, the first connection electrode BE1 is connected to the gate electrode G1 of the first transistor T1 through the first contact hole CNT1.

According to some aspects, the second contact hole CNT2 is a hole exposing the first electrode D3 of the third transistor T3 and the second electrode S4 of the fourth transistor T4 through the third gate insulating layer 133 and the second interlayer insulating layer 142. In some embodiments, the first connection electrode BE1 is connected to the first electrode D3 of the third transistor T3 and the second electrode S4 of the fourth transistor T4 through the second contact hole CNT2.

According to some aspects, the third contact hole CNT3 is a hole exposing the second initialization voltage line VIL2 through the second interlayer insulating layer 142. In some embodiments, the second connection electrode BE2 is connected to the second initialization voltage line VIL2 through the third contact hole CNT3.

According to some aspects, the fourth contact hole CNT4 is a hole exposing the first electrode S7 of the seventh transistor T7 through the first gate insulating layer 131, the second gate insulating layer 132, the first interlayer insulating layer 141, the third gate insulating layer 133, and the second interlayer insulating layer 142. In some embodiments, the second connection electrode BE2 is connected to the first electrode S7 of the seventh transistor T7 through the fourth contact hole CNT4.

According to some aspects the fifth contact hole CNT5 is a hole exposing the first electrode S2 of the second transistor T2 through the first gate insulating layer 131, the second gate insulating layer 132, the first interlayer insulating layer 141, the third gate insulating layer 133, and the second interlayer insulating layer 142. In some embodiments, the data line DL is connected to the first electrode S2 of the second transistor T2 through the fifth contact hole CNT5.

According to some aspects, the sixth contact hole CNT6 is a hole exposing the first electrode D4 of the fourth transistor T4 through the third gate insulating layer 133 and the second interlayer insulating layer 142. In some embodiments, the first initialization voltage line VIL1 is connected to the first initialization voltage line VIL1 through the sixth contact hole CNT6.

According to some aspects, the seventh contact hole CNT7 is a hole exposing the first electrode S5 of the fifth transistor T5 through the first gate insulating layer 131, the second gate insulating layer 132, the first interlayer insulating layer 141, the third gate insulating layer 133, and the second interlayer insulating layer 142. In some embodiments, the first driving voltage line VDDL1 is connected to the first electrode S5 of the fifth transistor T5 through the seventh contact hole CNT7.

According to some aspects, the eighth contact hole CNT8 is a hole exposing the first electrode LD1 of the light-sensing transistor LT1 through the third gate insulating layer 133 and the second interlayer insulating layer 142. In some embodiments, the second driving voltage line VDDL2 is connected to the first electrode LD1 of the light-sensing transistor LT1 through the eighth contact hole CNT8.

According to some aspects, the ninth contact hole CNT9 is a hole exposing the second electrode LS2 of the sensing switch transistor LT2 through the third gate insulating layer 133 and the second interlayer insulating layer 142. In some embodiments, the read-out line ROL is connected to the second electrode LS2 of the sensing switch transistor LT2 through the ninth contact hole CNT9.

According to some aspects, the tenth contact hole CNT10 is a hole exposing the second electrode D6 of the sixth transistor T6 through the first gate insulating layer 131, the second gate insulating layer 132, the first interlayer insulating layer 141, the third gate insulating layer 133, and the second interlayer insulating layer 142. In some embodiments, the third connection electrode BE3 is connected to the second electrode D6 of the sixth transistor T6 through the tenth contact hole CNT10.

According to some aspects, the first anode contact hole CNT_A is a hole exposing the third connection electrode BE3 through the first planarization layer 150. In some embodiments, the anode connection electrode ANDE is connected to the third connection electrode BE3 through the first anode contact hole CNT_A.

According to some aspects, the second anode contact hole AND_CNT is a hole exposing the anode connection electrode ANDE through the second planarization layer 160. In some embodiments, the pixel electrode 171 is connected to the anode connection electrode ANDE through the second anode contact hole AND_CNT.

According to some aspects, the light emitting element layer EML is formed on the thin film transistor layer TFTL. In some embodiments, the light emitting element layer EML includes the light emitting elements EL and a bank 180. In some embodiments, the light emitting elements EL and the bank 180 are formed on the second planarization layer 160. In some embodiments, each of the light emitting elements EL includes the pixel electrode 171, the organic light emitting layer 172, and the common electrode 173.

According to some aspects, the pixel electrode 171 is formed on the second planarization layer 160. In some embodiments, a pixel electrode 171 is provided for each pixel PX. In some embodiments, the pixel electrode 171 is connected to the anode connection electrode ANDE through the second anode contact hole AND_CNT. In some embodiments, the pixel electrode 171 includes a single-layer structure of molybdenum (Mo), titanium (Ti), copper (Cu), or aluminum (Al), or includes a stacked-layer structure including, for example, multiple layers of ITO/Mg, ITO/MgF, ITO/Ag, and ITO/Ag/ITO, including indium-tin-oxide (ITO), indium-zinc-oxide (IZO), zinc oxide (ZnO), indium oxide ($In_2O_3$) and silver (Ag), magnesium (Mg), aluminum (Al), platinum (Pt), lead (Pb), gold (Au), or nickel (Ni).

According to some aspects, the bank 180 is formed on the pixel electrode 171 and outlines the emission areas EA (EA1, EA2, and EA3) of each of the pixels PX (R, G, and B). In some embodiments, the bank 180 covers the edge of the pixel electrode 171. In some embodiments, the bank 180 is formed of an organic layer, such as an acryl resin layer, an epoxy resin layer, a phenolic resin layer, a polyamide resin layer, a polyimide resin layer, or the like.

According to some aspects, the emission area EA of each of the pixels PX represents an area in which the pixel electrode 171, the organic light emitting layer 172, and the common electrode 173 are sequentially stacked on top of each other and in which holes from the pixel electrode 171 and electrons from the common electrode 173 are combined with each other in the organic light emitting layer 172 to transmit light.

According to some aspects, the organic light emitting layer 172 is formed on the pixel electrode 171 and the bank 180. In some embodiments, the organic light emitting layer 172 includes an organic material that emits light in a predetermined color. In some embodiments, the organic light emitting layer 172 includes a hole transporting layer, an organic material layer, and an electron transporting layer. In some embodiments, among the pixels PX, the organic light emitting layer 172 of the first color pixel R emits light of a first color, the organic light emitting layer 172 of the second color pixel G emits light of a second color, and the organic light emitting layer 172 of the third color pixel B emits light of a third color. In some embodiments, the first color is red, the second color is green, and the third color is blue. In some embodiments, light emitted from the organic light emitting layer 172 contributes to a display of an image or is incident on the optical sensor PS (e.g., the organic light emitting layer 172 is a source of light that is incident on the optical sensor PS).

According to some aspects, the common electrode 173 is formed on the organic light emitting layer 172. In some embodiments, the common electrode 173 is disposed across the plurality of pixels PX, covering the bank 180 and the organic light emitting layer 172. In some embodiments, the common electrode 173 includes a conductive material having a low work function, such as Li, Ca, LiF/Ca, LiF/Al, Al, Mg, Ag, Pt, Pd, Ni, Au Nd, Jr, Cr, BaF, Ba, or a compound or mixture thereof (e.g., a mixture of Ag and Mg, etc.). In some embodiments, the common electrode 173 includes a transparent metal oxide, such as indium-tin-oxide (ITO), indium-zinc-oxide (IZO), zinc oxide (ZnO), or the like.

According to some aspects, the encapsulation layer TFEL is disposed on the light emitting element layer EML. In some embodiments, the encapsulation layer TFEL includes at least one inorganic layer that discourages oxygen or moisture from permeating the organic light emitting layer 172. In some embodiments, the encapsulation layer TFEL includes at least one organic layer that protects the organic light emitting layer 172 from foreign substances such as dust.

According to some aspects, the encapsulation layer TFEL is formed in a structure in which a first inorganic layer, an organic layer, and a second inorganic layer are sequentially stacked. In some embodiments, the first inorganic layer and the second inorganic layer are formed as a multilayer in which one or more inorganic layers selected from a silicon nitride layer, a silicon oxynitride layer, a silicon oxide layer, a titanium oxide layer, and an aluminum oxide layer are alternately stacked. In some embodiments, the organic layer is an organic layer such as an acrylic resin layer, an epoxy resin layer, a phenolic resin layer, a polyamide resin layer, or a polyimide resin layer.

According to some aspects, the base layer 205, the first touch insulating layer 215, the second touch conductive layer 220, and the second touch insulating layer 230 of the touch sensing layer TSL are sequentially disposed on the encapsulation layer TFEL. In some embodiments, the structure of the first touch conductive layer 210 including the first connector CP1 is the same as the structure of the second touch conductive layer 220.

According to some aspects, the second touch conductive layer 220 overlaps the bank 180. In some embodiments, the second touch conductive layer 220 is included in a mesh structure of the touch electrode SE, and includes at least one light-emission opening OP overlapping the emission area EA. In some embodiments, the second touch conductive layer 220 includes at least one light-transmission opening PH overlapping the first sensing channel LA1 of the light-sensing transistor LT1. In some embodiments, the at least one light-emission opening OP of the second touch conductive layer 220 does not block light emitted from the emission area EA. In some embodiments, the at least one light-transmission opening PH of the second touch conductive layer 220 allows light reflected by the user's fingerprint to pass therethrough without being interfered with by the touch electrode SE. Accordingly, the reflected light reaches the first sensing channel LA1 of the light-sensing transistor LT1.

Figure 15:
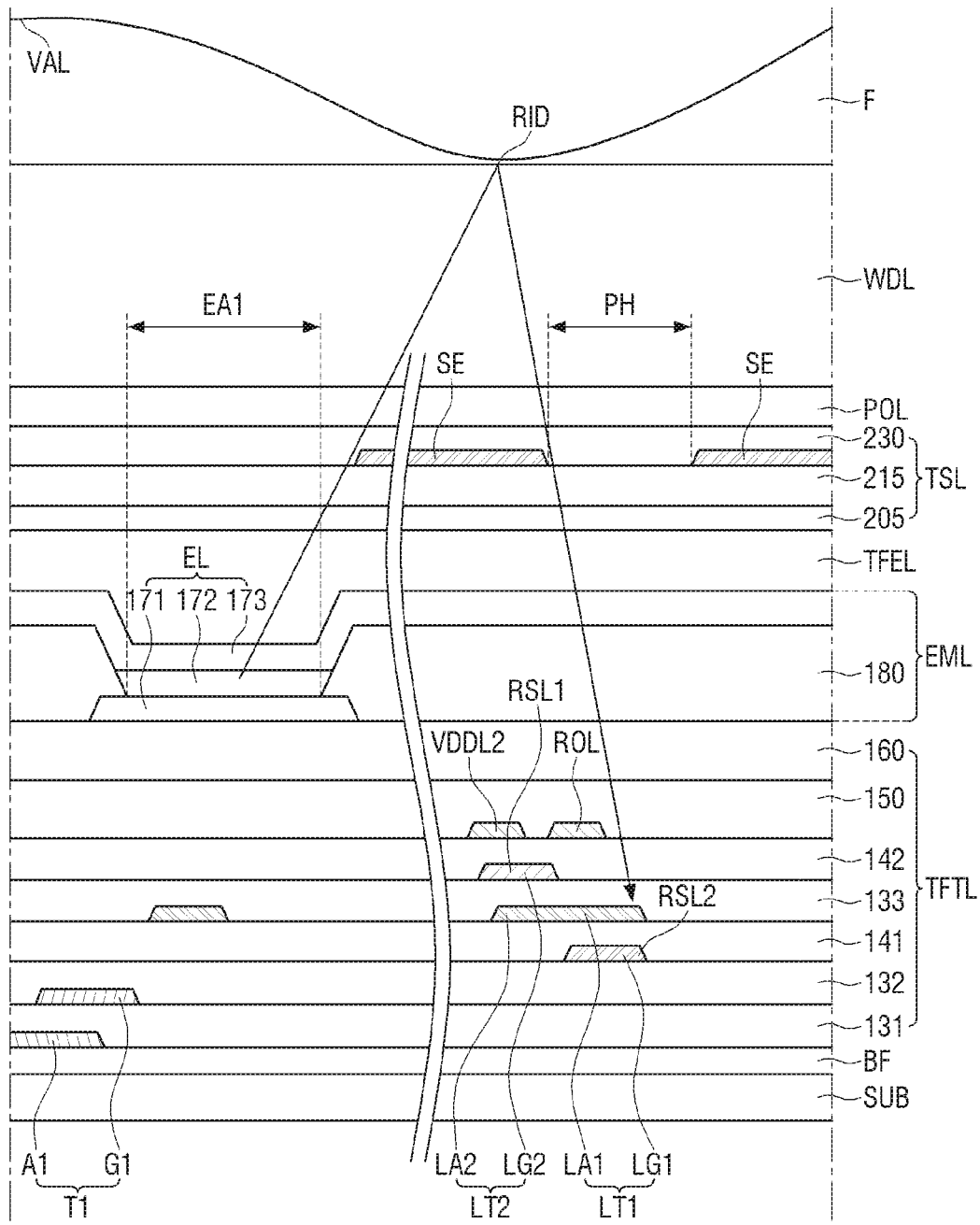
FIG. 15 is a diagram schematically illustrating a path of light through which a user's fingerprint is recognized in FIG. 14.
Figure 16:
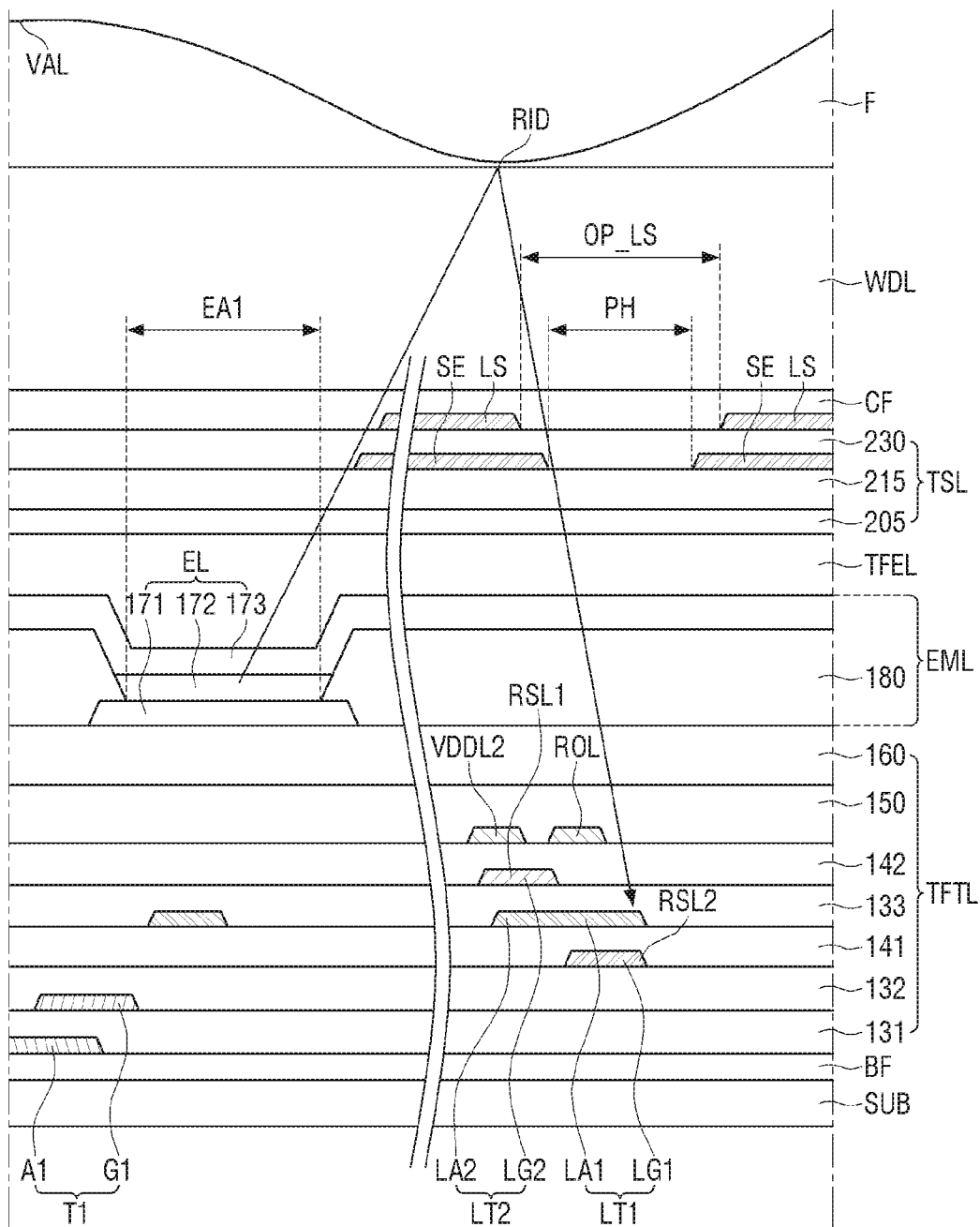
FIG. 16 is a diagram schematically illustrating a path of light through which the user's fingerprint is recognized in FIG. 14.

FIG. 15 is a diagram schematically illustrating a path of light through which a user's fingerprint is recognized in FIG. 14 according to at least one embodiment.

Referring to FIG. 15, according to some aspects, the display device 1 further includes a polarizing film POL and a window WDL disposed on the touch sensing layer TSL. In some embodiments, the polarizing film POL is disposed on the touch sensing layer TSL and reduces a reflection of external light, and the window WDL is disposed on the polarizing film POL and protects the components of the display device 1.

According to some aspects, when the user's fingerprint F touches the window WDL of the display device 1, light emitted from the organic light emitting layer 172 is reflected from the ridge RID or the valley VAL of the user's fingerprint F. The light reflected from the ridge RID or the valley VAL of the user's fingerprint F is incident on the light-sensing transistor LT1 of the optical sensor PS through the light transmission portion PH. Therefore, the light-sensing transistor LT1 is able to identify the user's fingerprint pattern by detecting the incident light.

FIG. 16 is a diagram schematically illustrating the path of light through which the user's fingerprint is recognized in FIG. 14 according to at least one embodiment.

Referring to FIG. 16, according to some aspects, a light-blocking layer LS and a color filter CF are disposed in the display device 1 between the touch sensing layer TSL and the window WDL, and the polarizing film POL is omitted.

According to some aspects, the light-blocking layer LS is formed of a material that blocks light emitted from the emission area EA. In some embodiments, the light-blocking layer LS includes a black matrix that absorbs visible light. In some embodiments, the light-blocking layer LS reduces color mixing between color pixels included in the respective pixels PX.

According to some aspects, the color filter CF is formed on the light blocking-layer LS and covers the light-blocking layer LS. In some embodiments, the color filter CF includes a material that is disposed on each pixel PX and converts light of the same wavelength band.

According to some aspects, the light-blocking layer LS includes a light-blocking layer opening OP_LS through which light reflected by the user's fingerprint F passes. In some embodiments, the light-blocking layer opening OP_LS overlaps the light transmitting portion PH of the second touch conductive layer 220 and overlaps the first sensing channel LA1 of the light-sensing transistor LT1. Accordingly, in some embodiments, the light-blocking layer opening OP_LS provides a path through which the reflected light passes to be incident on the first sensing channel LA1.

According to some aspects, the light reflected from the ridge RID or valley VAL of the user's fingerprint F is incident on the light-sensing transistor LT1 of the optical sensor PS through the light-blocking layer opening OP_LS and the light transmitting portion PH. Therefore, the light-sensing transistor LT1 is capable of identifying the user's fingerprint pattern by detecting incident light.

In summary, in the display device 1 according to at least one embodiment, the light-sensing transistor LT1 has a lower gate structure and includes the light sensitive first sensing channel LA1 that receives light reflected by a user's fingerprint, thereby generating a photocurrent in response to receiving the light. Further, since the second touch conductive layer 220 includes the plurality of light-transmission openings PH overlapping the first sensing channel LA1 of the light-sensing transistor LT1, light incident to the substrate SUB may pass through the plurality of light-transmission openings PH. Accordingly, the incident light passes through the plurality of light-transmission openings PH to reach the first sensing channel LA1 of the optical sensor PS without being blocked by the touch electrode SE. Therefore, the optical sensor PS is able to recognize the fingerprint F according to the amount of light incident from above the display device 1.

Figure 17:
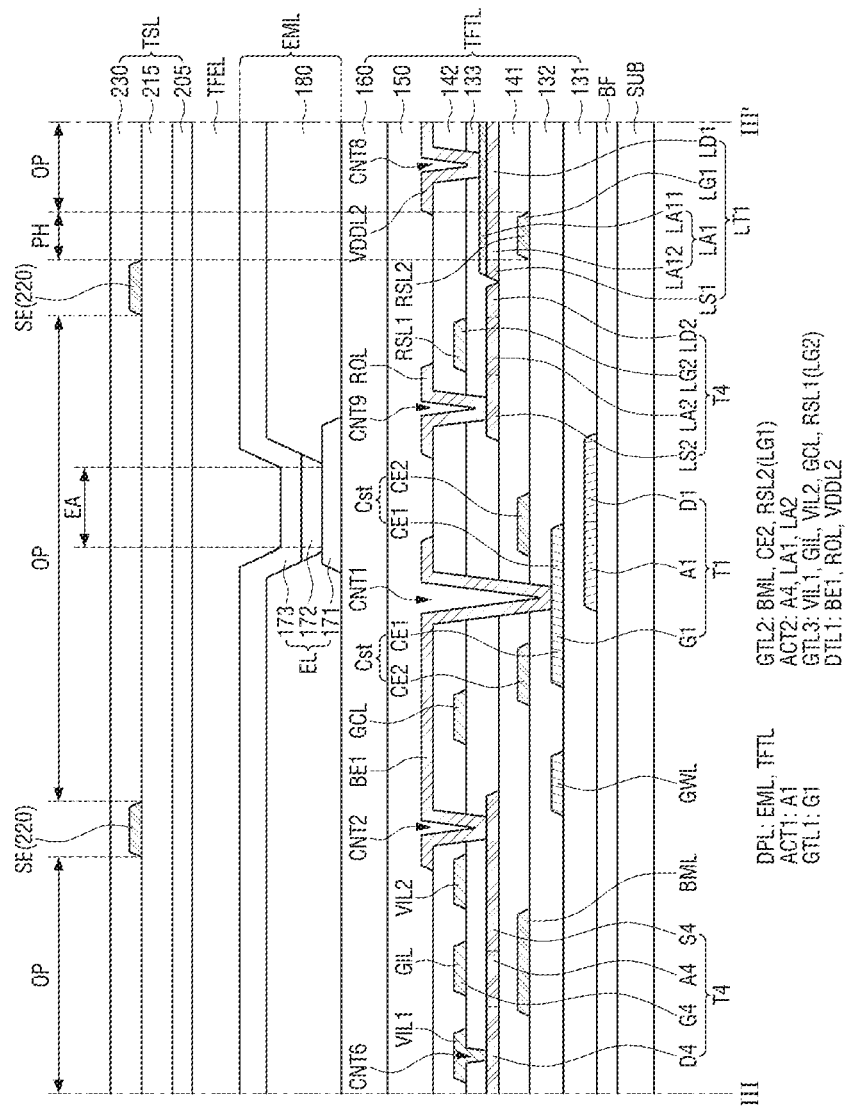
FIG. 17 is a cross-sectional view taken along line III-III' of FIGS. 10 and 11.

FIG. 17 is a cross-sectional view taken along line III-III' of FIGS. 10 and 11 according to at least one embodiment.

Referring to FIG. 17, according to some aspects, a display device 1_2 includes a first sensing channel LA1 of the light-sensing transistor LT1 and a second sensing channel LA2 of the second sensing switch transistor LT2, where the structure of the first sensing channel LA1 is different from the structure of the second sensing channel LA2. In some embodiments, the first sensing channel LA1 includes a first sub-sensing channel LA11 disposed at an upper side of the first sensing channel LA1 and a second sub-sensing channel LA12 disposed at a lower side of the first sensing channel LA1.

According to some aspects, the first sub-sensing channel LA11 includes a light sensitive oxide semiconductor having high light absorptance. In some embodiments, as the first sub-sensing channel LA11 is directly disposed on the top surface of the first sensing channel LA1, and is sensitive to external light, light sensitivity of the display device 1_2 can be increased when external light is incident through the light-transmission openings PH. In some embodiments, the first sub-sensing channel LA11 includes ZnO, InO, SnO, InZnO, ZnSnO, InSnO, or the like.

According to some aspects, the second sub-sensing channel LA12 includes a light insensitive oxide semiconductor having low light absorptance. In some embodiments, as the second sub-sensing channel LA12 includes the light insensitive oxide semiconductor, to the second sub-sensing channel LA12 reduces instability in electrical characteristics that might be caused by light penetrating from the rear of the substrate SUB. In some embodiments, the second sub-sensing channel LA12 includes at least one of Hf, Zr, Ti, Ta, Ga, Nb, V, Al, Ga, or Sn in addition to ZnO, InO, SnO, InZnO, ZnSnO, or InSnO.

Accordingly, in the display device 1_2, a light absorption efficiency of the light-sensing transistor LT1 including the first sensing channel LA1 is improved, and fluctuations in electrical characteristics from external reasons is reduced.

According to some aspects, the first sensing channel LA1 is formed of a single layer including a light sensitive oxide semiconductor material. In some embodiments, the first sensing channel LA1 is formed of various stacked structures. In some embodiments, the light absorptance of the first sensing channel LA1 is higher than the light absorptance of the first semiconductor layer ACT1.

According to some aspects, the second sensing channel LA2 includes a light sensitive oxide semiconductor material. In some embodiments, the second sensing channel LA2 includes a light insensitive oxide semiconductor material that is not sensitive to light. In some embodiments, the light sensitive layer oxide semiconductor material includes at least one of Hf, Zr, Ti, Ta, Ga, Nb, V, Al, Ga, or Sn, in addition to at least one of ZnO, InO, SnO, InZnO, ZnSnO or InSnO as. In some embodiments, the sensing switch transistor LT2 functions as a switch transistor having constant electrical characteristics that are independent of an application of light to the sensing switch transistor LT2.

Figure 18:
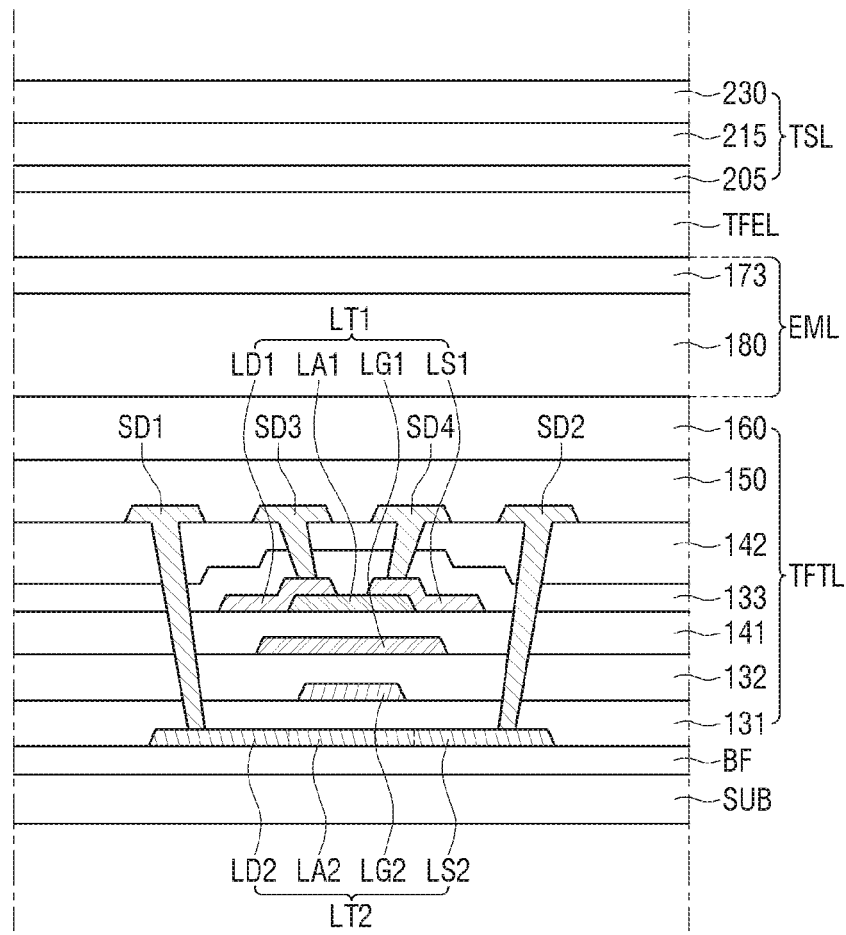
FIG. 18 is a cross-sectional view of an optical sensor according to at least one embodiment.

FIG. 18 is a cross-sectional view of an optical sensor according to at least one embodiment.

Referring to FIG. 18, according to some embodiments, the optical sensor PS has a stacked structure including the first semiconductor layer ACT1 and the second semiconductor layer ACT2.

In some embodiments, the first sensing channel LA1 of the light-sensing transistor LT1 is disposed in the second semiconductor layer ACT2 on the gate electrode LG1. In some embodiments, the top surface and the side surface of the first sensing channel LA1 is covered by the first electrode LD1 and the second electrode LS2. In some embodiments, the gate electrode LG1 is disposed under the first sensing channel LA1 and overlaps the first sensing channel LA1, thereby forming the light-sensing transistor LT1 a bottom gate structure. In some embodiments, each of the first electrode LD1 and the second electrode LS1 covers the top surface and the side surface of the first sensing channel LA1, respectively. In some embodiments, the first electrode LD1 and the second electrode LS1 are respectively connected to a third source/drain electrode SD3 and a fourth source/drain electrode SD4 disposed in the first data conductive layer DTL1.

According to some aspects, the second sensing channel LA2 of the sensing switch transistor LT2 is disposed in the first semiconductor layer ACT1 under the gate electrode LG2. In some embodiments, the gate electrode LG2 is disposed on the second sensing channel LA2 and overlaps the second sensing channel LA2. In some embodiments, the first electrode LD2 is connected to the first source/drain electrode SD1 disposed in the first data conductive layer DTL1, and the second electrode LS2 is connected to the second source/drain electrode SD2 disposed in the first data conductive layer DTL1.

According to some aspects, the area occupied by the optical sensors PS disposed adjacent to each pixel PX in the display device is minimized by stacking the optical sensors PS in a direction perpendicular to the substrate SUB.

Hereinafter, a display device 1_3 will be described with reference to FIGS. 19 and 20.

Figure 19:
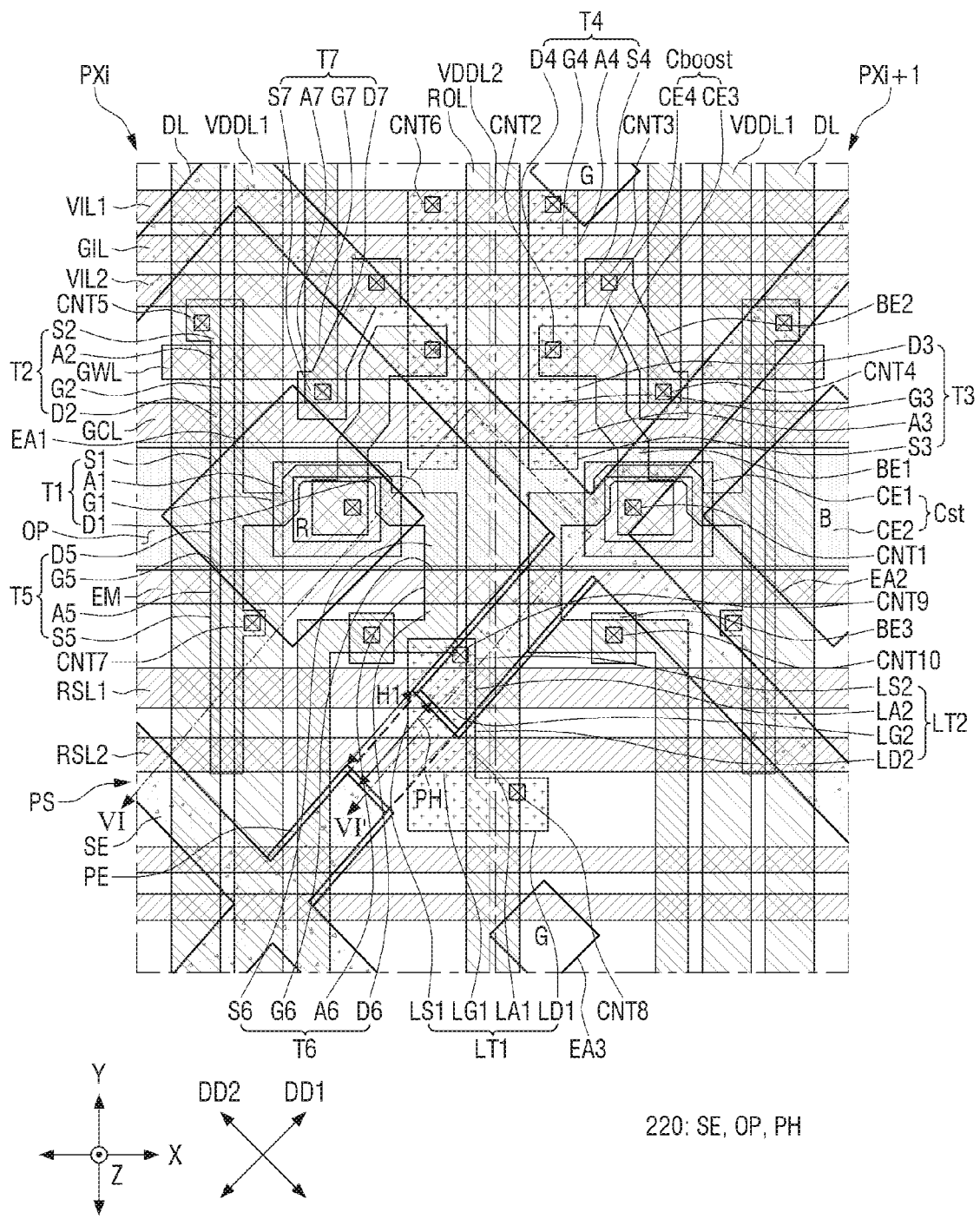
FIG. 19 is a layout diagram illustrating thin film transistor layers and mesh conductive layers of pixels and optical sensors according to at least one embodiment.

FIG. 19 is a layout diagram illustrating thin film transistor layers and mesh conductive layers of pixels and optical sensors according at least one embodiment. FIG. 20 is a cross-sectional view taken along line VI-VI' of FIG. 19.

Figure 20:
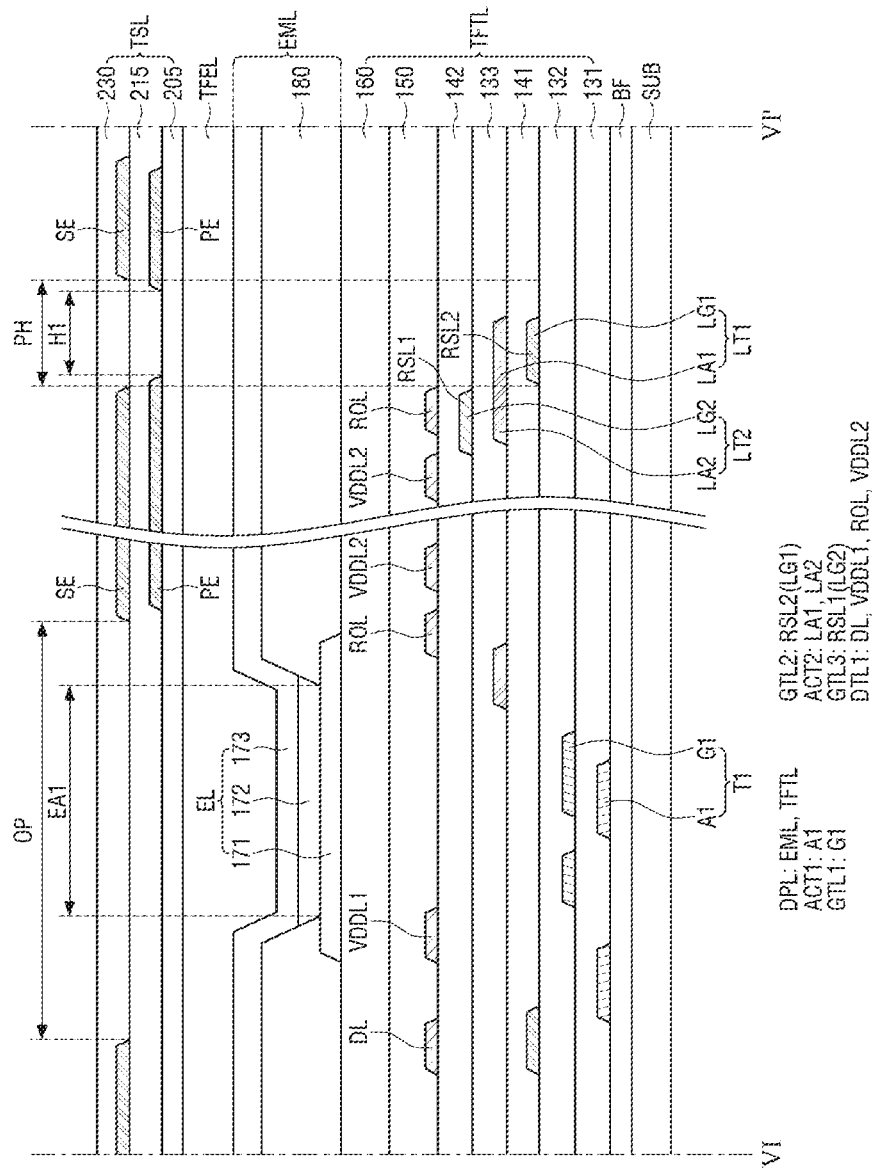
FIG. 20 is a cross-sectional view taken along line VI-VI' of FIG. 19.

According to some aspects, the display device 1_3 of FIGS. 19 and 20 further includes an auxiliary touch electrode PE overlapping the touch electrode SE. In some embodiments, the auxiliary touch electrode PE is disposed in the first touch conductive layer 210 that includes the first connector CP1. In some embodiments, the auxiliary touch electrode PE is disposed under the touch electrode SE in which the light transmitting portion PH is formed, overlaps the touch electrode SE, and includes a first hole H1 overlapping the light transmitting portion PH. In some embodiments, a width of the first hole H1 in one direction is smaller than a width of the light transmitting portion PH in the one direction.

According to some aspects, the first hole H1 of the first touch conductive layer 210 and the light transmitting portion PH of the second touch conductive layer 220 overlap, and the light reflected from the user's fingerprint is therefore incident on the light-sensing transistor LT1 of the optical sensor PS through the at least one light-transmission opening PH and the first hole H1. In some embodiments, as the reflected light is incident on the light-sensing transistor LT1 through the plurality of holes, a pin hole effect is increased. For example, when the area on which the incident light is incident is narrowed as the incident light approaches the target object, the incident light is focused, so that clearer light is introduced. For example, the area of the incident light incident on the light-sensing transistor LT1 is narrowed as it passes through the at least one light-transmission opening PH and passes through the first hole H1 having a smaller width than the light transmitting portion PH. Accordingly, the incident light is focused so that clearer light is incident on the light-sensing transistor LT1.

Figure 21:
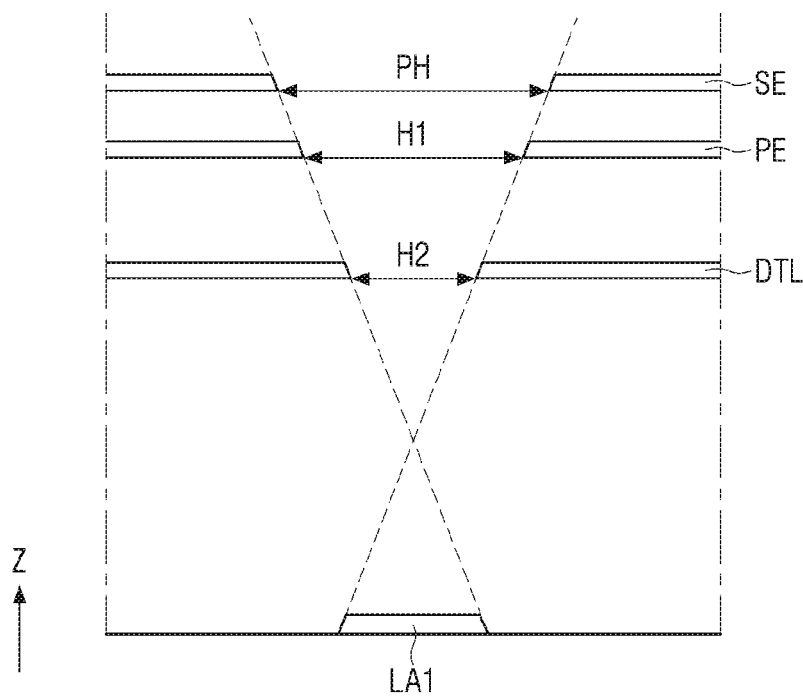
FIG. 21 is a cross-sectional view illustrating the data conductive layer and the touch sensing layer of FIG. 19.

FIG. 21 is a cross-sectional view illustrating the data conductive layer and the touch sensing layer of FIG. 19.

FIG. 21 illustrates an area of incident light when the light reflected from the fingerprint is incident on the first sensing channel LA1 of the light-sensing transistor LT1. Similarly to embodiments described with reference to FIGS. 19 and 20, according to some aspects, the touch electrode SE having the light transmitting portion PH and the auxiliary touch electrode PE having the first hole H1 are disposed on the first sensing channel LA1. In some embodiments, the data conductive layer DTL includes the second hole H2 with a smaller width in the region where the light transmitting portion PH and the first hole H1 overlap, and the pin hole effect is therefore maximized. In some embodiments, the data conductive layer DTL includes the first connection electrode BE1, the second connection electrode BE2, and the third connection electrode BE3 disposed on the first data conductive layer DTL1, and is implemented as a signal line such as the first sensing scan line RSL1 or a voltage line such as the first initialization voltage line VIL1 disposed in the first to third gate layers GTL1, GTL2, and GTL3.

Accordingly, the area of the incident light incident to the light-sensing transistor LT1 is narrowed as it passes through the light transmitting portion PH, the first hole H1 having the smaller width than the light transmitting portion PH, and the second hole H2 having the smaller width than the first hole H1. Therefore, the incident light is focused so that clearer light is incident to the first sensing channel LA1 of the light-sensing transistor LT1.

Figure 22:
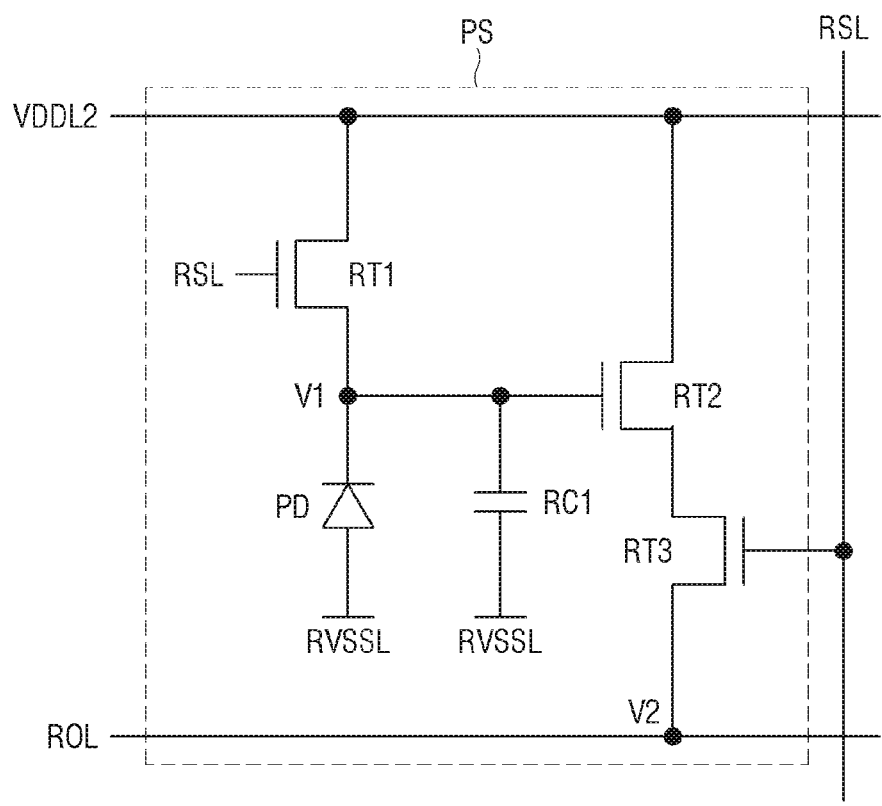
FIG. 22 is a circuit diagram illustrating an optical sensor according to at least one embodiment.

FIG. 22 is a circuit diagram illustrating an example of an optical sensor according to at least one embodiment.

Referring to FIG. 22, according to some aspects, the optical sensor PS includes a photodiode PD, first to third sensing transistors RT1, RT2, and RT3, and a sensing capacitor RC1.

According to some aspects, the first sensing transistor RT1 is a reset transistor that resets a potential $V_1$ of a first electrode of the sensing capacitor RC1 according to a reset signal of a reset signal line RSL. In some embodiments, a gate electrode of the first sensing transistor RT1 is connected to the reset signal line RSL, a source electrode of the first sensing transistor RT1 is connected to a cathode electrode of the photodiode PD and the first electrode of the sensing capacitor RC1, and a drain electrode of the first sensing transistor RT1 is connected to the second driving voltage line VDDL2 to which a first sensing driving voltage is applied.

According to some aspects, the second sensing transistor RT2 is an amplifying transistor that converts a potential $V_1$ of the first electrode of the sensing capacitor RC1 into a current signal and amplifies the current signal. In some embodiments, a gate electrode of the second sensing transistor RT2 is connected to a cathode electrode of the photodiode PD and the first electrode of the sensing capacitor RC1, a source electrode of the second sensing transistor RT2 is connected to a drain electrode of the third sensing transistor RT3, and a drain electrode of the second sensing transistor RT2 is connected to the second driving voltage line VDDL2.

According to some aspects, the third sensing transistor RT3 is a selection transistor, such that the current signal is transmitted to the read-out line ROL by the potential $V_1$ of the first electrode of the sensing capacitor RC1 amplified by the second sensing transistor RT2 when a sensing scan signal is applied to the sensing scan line RSL. In some embodiments, a gate electrode, a source electrode, and a drain electrode of the third sensing transistor RT3 are connected to the sensing scan line RSL, the read-out line ROL, and the source electrode of the second sensing transistor RT2, respectively.

According to some aspects, the photodiode PD includes an anode electrode, a PIN semiconductor layer, and a cathode electrode. In some embodiments, the anode electrode of the photodiode PD is connected to the first electrode of the sensing capacitor RC1, and the cathode electrode of the photodiode PD is connected to a sensing common voltage line RVSSL to which a second sensing driving voltage lower than the first sensing driving voltage is applied. In some embodiments, the PIN semiconductor layer of the photodiode PD includes a P-type semiconductor layer connected to the anode electrode, an N-type semiconductor layer connected to the cathode electrode, and an I-type semiconductor layer disposed between the P-type semiconductor layer and the N-type semiconductor layer.

In some embodiments, the first to third sensing transistors RT1, RT2, and RT3 are formed as N-type metal oxide semiconductor field effect transistors (MOSFETs). In some embodiments, the first to third sensing transistors RT1, RT2, and RT3 are formed as P-type MOSFETs.

Hereinafter, the operation of the optical sensor PS shown in FIG. 22 will be described in detail.

First, when the first sensing transistor RT1 is turned on by the reset signal of the reset signal line RSL, the potential $V_1$ of the first electrode of the sensing capacitor RC1 is reset to the potential of the first sensing driving voltage of the second driving voltage line VDDL2.

Second, when light reflected by a user's fingerprint is incident on the photodiode PD, a leakage current may flow in the photodiode PD. In some embodiments, the sensing capacitor RC1 is charged by the leakage current.

In some embodiments, as the sensing capacitor RC1 is charged, the potential of the gate electrode of the second sensing transistor RT2 connected to the first electrode of the sensing capacitor RC1 increases. When the potential of the gate electrode of the second sensing transistor RT2 exceeds a threshold voltage, the second sensing transistor RT2 turns on.

Third, when the sensing scan signal is applied to the sensing scan line RSL, the third sensing transistor RT3 turns on. When the third sensing transistor RT3 turns on, the current signal flowing through the second sensing transistor RT2 by the potential $V_1$ of the first electrode of the sensing capacitor RC1 is transmitted to the read-out line ROL. As a result, a potential $V_2$ of the read-out line ROL increases, and the potential $V_2$ of the read-out line ROL is transmitted to a fingerprint sensor IC. The fingerprint sensor IC converts the potential $V_2$ of the read-out line ROL into a digital signal through an analog-digital converter ADC.

According to some aspects, the potential $V_2$ of the read-out line ROL is proportional to the potential $V_1$ of the first electrode of the sensing capacitor RC1. For example, the amount of charges stored in the sensing capacitor RC1 is proportional to the amount of light supplied to the photodiode PD. Therefore, it is possible to determine how much light is incident on the photodiode PD of the optical sensor PS based on the potential $V_2$ of the read-out line ROL. In some embodiments, the fingerprint sensor IC detects the incident amount of light for each optical sensor PS so that the user's fingerprint pattern can be recognized.

Figure 23:
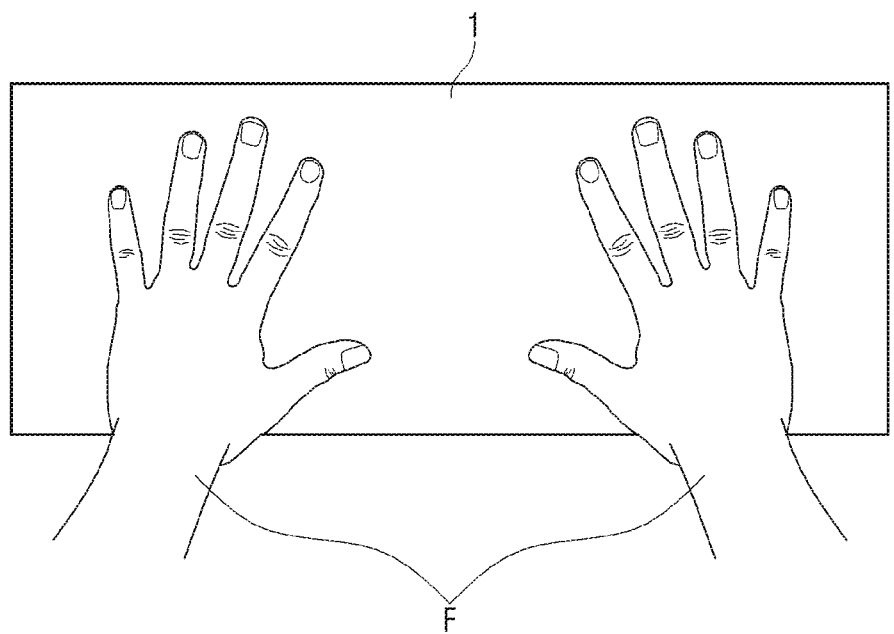
FIG. 23 is a diagram illustrating a display device providing full-surface sensing according to at least one embodiment.

FIG. 23 is a diagram illustrating a display device providing full-surface sensing according to at least one embodiment. Referring to FIG. 23, when a plurality of pixels described with reference to FIG. 1 and a plurality of optical sensors described with reference to FIG. 1 are formed in the display panel described with reference to FIG. 1 in the display device 1, an active region described with reference to FIG. 1 corresponds to a fingerprint sensor described with reference to FIG. 1.

According to some aspects, the optical sensor PS generates a photocurrent according to a change in the amount of received light, even if only a portion of the display panel 10 is touched by a user fingerprint. In some embodiments, a read-out circuit described with reference to FIG. 1 generates fingerprint detection data according to a magnitude of current from the optical sensor PS and transmits the generated fingerprint detection data to a processor. The processor analyzes the fingerprint detection data and determines if the fingerprint matches the user's fingerprint by comparing it with a predetermined fingerprint.

According to some aspects, when the predetermined fingerprint and the fingerprint detection data transmitted from the read-out circuit are the same, predetermined functions may be performed in response to the determination. In some embodiments, the predetermined functions include various functions such as unlocking an application, unlocking a screen of the display device, authorizing a purchase, etc.

Figure 24:
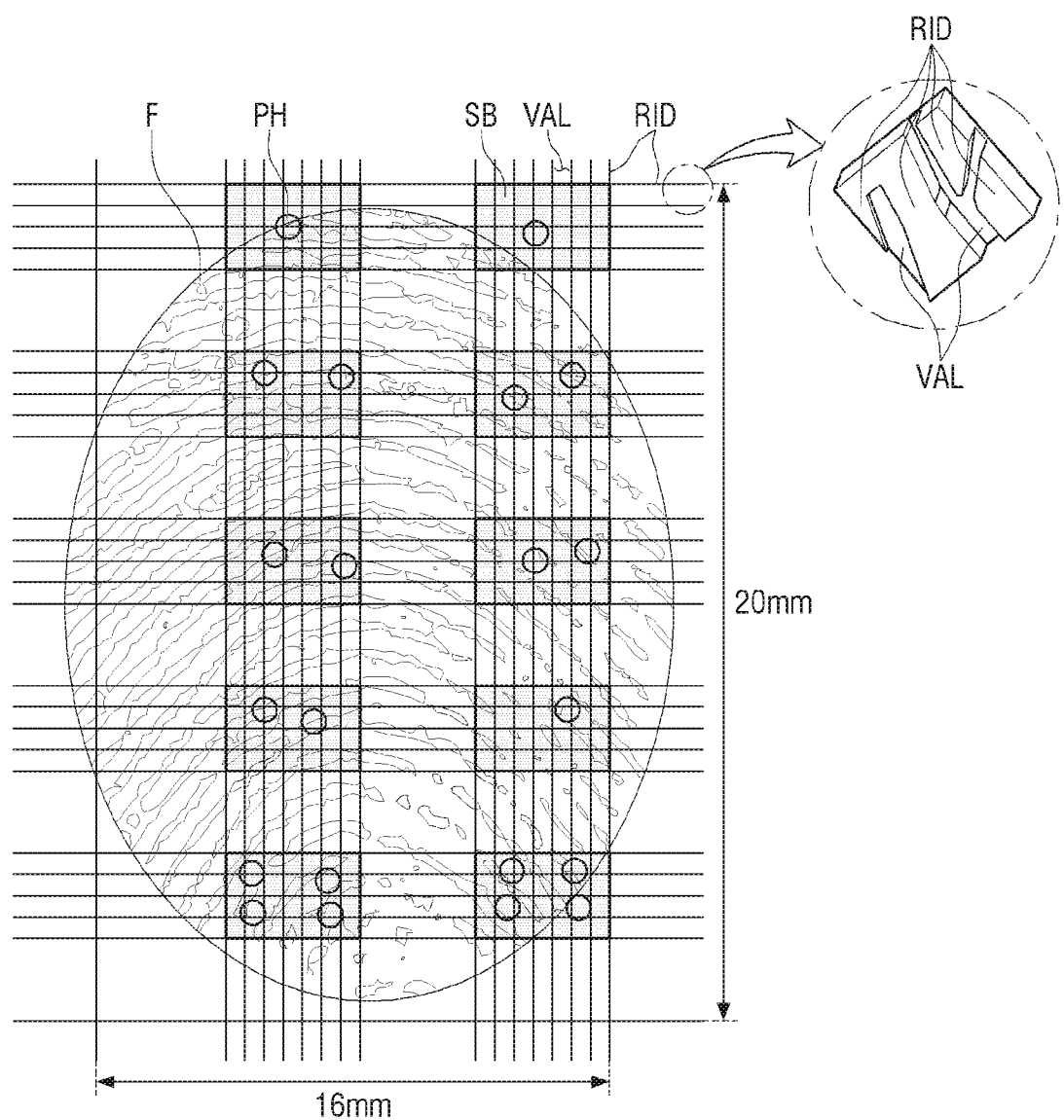
FIG. 24 is a diagram illustrating a fingerprint recognition area in a display device according to at least one embodiment.

FIG. 24 is a diagram illustrating a fingerprint recognition area in a display device according to at least one embodiment. According to some aspects, in the display device 1, optical sensors PS increase a resolution of the display panel 10 by being disposed adjacent to only some of the pixels PX. In general, since the area of the light incident on the display panel 10 including the optical sensors PS is larger than the area occupied by one pixel PX, it is possible to relatively accurately specify the position on which the light is incident, even when the optical sensors PS are disposed adjacent to only some of the pixels PX as shown in FIG. 24.

In an example, a width of the user's fingerprint F in the first horizontal direction (the X-axis direction) is 16 mm, and the width of the user's fingerprint F in the second horizontal direction (the Y-axis direction) is 20 mm. The fingerprint F may be composed of a plurality of valleys VAL and ridges RID, and each of the lines extending in the first horizontal direction (the X-axis direction) and the second horizontal direction (the Y-axis direction) in the drawing represents a ridge RID. In this case, the distance between the ridges RID and the distance between the valleys VAL may be in the range of about 100 μm to about 150 μm.

According to some aspects, the area in which the user's fingerprint F is sensed may be adjusted based on the number and the position of the light-transmission openings PH formed in the regions overlapping the optical sensors PS. As shown in FIG. 24, when the regions in which the light-transmission openings PH overlapping the optical sensors PS are formed are defined as sensing regions SB, the total area of the sensing regions SB may occupy 25% of the area of the fingerprint F. Even if the sensing regions SB are equivalent to 25% of the area of the fingerprint F, the display device 1 is capable of identifying whether or not the fingerprint F matches the user's fingerprint by combining information from some regions of the fingerprint F. Thus, even if the light-transmission openings PH overlapping the optical sensors PS are not disposed in the entire area of the display panel 10, the full-surface sensing as shown in FIG. 23 is provided. If the number of the light-transmission openings PH is appropriately selected, the resolution of the display panel 10 may be improved.

While the inventive concept has been particularly shown and described with reference to embodiments thereof, it will be understood that various changes in form and details may be made therein without departing from the spirit and scope of the present disclosure.

What is claimed is:

1. A display device comprising:
   a substrate;
   a plurality of pixels disposed on the substrate and including a first emission area and a second emission area configured to emit light, wherein at least one pixel of the plurality of pixels comprises:

a light emitting element;

a first transistor providing a driving current to the light emitting element and including a first channel, a first electrode, and a second electrode; and a second transistor electrically connected to the first electrode or the second electrode and including a second channel, wherein the first channel and the second channel include different materials from each other;

a plurality of optical sensors disposed on the substrate and comprising a light-sensing transistor including a first sensing channel configured to sense light;

a bank disposed on the plurality of pixels and the plurality of optical sensors; and a touch conductive layer disposed on the bank and including touch electrodes, wherein the touch conductive layer comprises a light-transmission opening disposed between the first emission area, the second emission area, and the touch electrodes, wherein the first channel includes polysilicon, and each of the second channel and the first sensing channel include an oxide semiconductor, and wherein the light-transmission opening overlaps the bank and the light-sensing transistor in a thickness direction of the substrate.

2. The display device of claim 1, wherein the touch electrode does not overlap the light-sensing transistor.

3. The display device of claim 1, wherein the light-transmission opening overlaps the first sensing channel in the thickness direction of the substrate.

4. The display device of claim 3, further comprising a light-blocking layer disposed on the touch electrode and comprising a light-blocking layer opening through which light is incident, wherein the light-blocking layer opening overlaps the light-transmission opening, the bank, and the first sensing channel in the thickness direction of the substrate.

5. The display device of claim 3, further comprising:

a connector configured to connect a proximate pair of the touch electrodes through a contact hole; and an auxiliary touch electrode disposed on the same layer as the connector, wherein the auxiliary touch electrode comprises a first hole overlapping the light-transmission opening in the thickness direction of the substrate.

6. The display device of claim 5, wherein a width of the light-transmission opening is smaller than a width of the first hole.

7. The display device of claim 1, wherein the plurality of pixels comprises an $i^{th}$ pixel and an $(i+1)^{th}$ pixel adjacent to each other, and i is a positive integer, the display device further comprising:

a read-out line disposed in the $i^{th}$ pixel and outputting a light-sensing voltage; and a driving voltage line disposed in the $(i+1)^{th}$ pixel and outputting a driving voltage, wherein at least one optical sensor of the plurality of optical sensors is connected to the read-out line and the driving voltage line.

8. The display device of claim 1, wherein the touch conductive layer includes a light-emission opening exposing the first emission area and the second emission area, and a size of the light-emission opening is larger than a size of the light-transmission opening.

9. The display device of claim 8, wherein the touch conductive layer further comprises a plurality of slits exposing gaps between proximate pairs of pixels of the plurality of pixels, and at least one slit of the plurality of slits overlaps the bank and does not overlap the light-sensing transistor.

10. A display device comprising:

a substrate;

a plurality of pixels disposed on the substrate and including a first emission area and a second emission area configured to emit light, wherein at least one pixel of the plurality of pixels comprises:

a light emitting element;

a first transistor providing a driving current to the light emitting element and including a first channel, a first electrode, and a second electrode; and a second transistor electrically connected to the first electrode or the second electrode and including a second channel, wherein the first channel and the second channel include different materials from each other;

a plurality of optical sensors disposed on the substrate and comprising a light-sensing transistor including a first sensing channel configured to sense light;

a bank disposed on the plurality of pixels and the plurality of optical sensors; and a touch conductive layer disposed on the bank and including touch electrodes, wherein the touch conductive layer comprises a light-transmission opening disposed between the first emission area, the second emission area, and the touch electrodes, wherein at least one optical sensor of the plurality of optical sensors further comprises a sensing switch transistor including a second sensing channel and a gate electrode connected to a first sensing scan line, and the light-sensing transistor includes a gate electrode connected to a second sensing scan line.

11. The display device of claim 10, wherein the light-transmission opening does not overlap the second sensing channel.

12. The display device of claim 10, wherein the gate electrode of the light-sensing transistor is disposed on the first sensing channel.

13. The display device of claim 12, wherein the second sensing channel is disposed on a same layer as the first sensing channel.

14. A display device comprising:

a substrate;

a first semiconductor layer comprising a first channel disposed on the substrate;

a first gate layer disposed on the first semiconductor layer and comprising a gate electrode overlapping the first channel;

a second gate layer disposed on the first gate layer and comprising a first sensing scan line;

a second semiconductor layer disposed on the second gate layer and comprising a first sensing channel overlapping the first sensing scan line; and a touch conductive layer comprising touch electrodes disposed on the second semiconductor layer and at least one light-transmission opening disposed between a proximate pair of the touch electrodes and overlapping the first sensing channel, wherein the touch electrode does not overlap the first sensing channel, and wherein the second gate layer further comprises a scan line and a second sensing scan line spaced apart from the first sensing scan line, the scan line overlaps a second channel of the second semiconductor layer, and the second sensing scan line overlaps a second sensing channel of the second semiconductor layer.

15. The display device of claim 14, wherein the first semiconductor layer includes polysilicon, and the second semiconductor layer includes an oxide semiconductor.

16. The display device of claim 15, wherein the second semiconductor layer includes a light-sensitive oxide semiconductor.

17. The display device of claim 16, wherein the first sensing channel comprises a first sub-sensing channel and a second sub-sensing channel disposed on a bottom surface of the first sub-sensing channel, the first sub-sensing channel includes a light-sensitive oxide semiconductor, and the second sub-sensing channel includes a light-insensitive oxide semiconductor.

\* \* \* \* \*